(12) United States Patent
Li et al.

(10) Patent No.: US 8,951,430 B2
(45) Date of Patent: Feb. 10, 2015

(54) METAL ASSISTED CHEMICAL ETCHING TO PRODUCE III-V SEMICONDUCTOR NANOSTRUCTURES

(71) Applicant: The Board of Trustees of the University of Illinois, Urbana, IL (US)

(72) Inventors: Xiuling Li, Champaign, IL (US); Matthew T. Dejarld, Champaign, IL (US); Jae Cheol Shin, Gwangsan-gu (KR); Winston Chern, Cambridge, MA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 13/833,462

(22) Filed: Mar. 15, 2013

(65) Prior Publication Data

US 2013/0280908 A1    Oct. 24, 2013

Related U.S. Application Data

(60) Provisional application No. 61/625,905, filed on Apr. 18, 2012.

(51) Int. Cl.
| | |
|---|---|
| *C03C 15/00* | (2006.01) |
| *H01L 21/306* | (2006.01) |
| *H01L 33/00* | (2010.01) |
| *H01L 31/18* | (2006.01) |
| *H01L 33/20* | (2010.01) |

(52) U.S. Cl.
CPC ...... *H01L 21/30612* (2013.01); *H01L 33/0062* (2013.01); *H01L 31/184* (2013.01); *Y10S 977/762* (2013.01); *H01L 33/20* (2013.01)

USPC ............... 216/83; 216/56; 438/571; 438/745; 438/750; 438/753; 438/754; 252/79.1; 977/762

(58) Field of Classification Search
USPC ............... 216/56, 83; 438/745, 750, 753, 754, 438/571; 252/79.1
See application file for complete search history.

(56) References Cited

U.S. PATENT DOCUMENTS

| | | | |
|---|---|---|---|
| 6,790,785 B1 | 9/2004 | Li et al. | |
| 8,334,216 B2* | 12/2012 | Lin et al. | ............ 438/745 |

OTHER PUBLICATIONS

DeJarld et al. Nano Letters, vol. 11, (2011) pp. 5259-5263.*
Asoh, H. et al., "Effect of Noble Metal Catalyst Species on the Morphology of Macroporous Silicon Formed by Metal-Assisted Chemical Etching," *Electrochimica Acta*, 54 (2009) pp. 5142-5148.
Asoh, H. et al., "Formation of Periodic Microbump Arrays by Metal-Assisted Photodissolution of InP," *Japanese Journal of Applied Physics*, 49 (2010) pp. 046505-1-046505-5.

(Continued)

*Primary Examiner* — Duy Deo
*Assistant Examiner* — Maki Angadi
(74) *Attorney, Agent, or Firm* — Brinks Gilson & Lione

(57) ABSTRACT

Methods of metal assisted chemical etching III-V semiconductors are provided. The methods can include providing an electrically conductive film pattern disposed on a semiconductor substrate comprising a III-V semiconductor. At least a portion of the III-V semiconductor immediately below the conductive film pattern may be selectively removed by immersing the electrically conductive film pattern and the semiconductor substrate into an etchant solution comprising an acid and an oxidizing agent having an oxidation potential less than an oxidation potential of hydrogen peroxide. Such methods can form high aspect ratio semiconductor nanostructures.

18 Claims, 17 Drawing Sheets

(56) References Cited

OTHER PUBLICATIONS

Balasundaram, K. et al., "Porosity Control in Metal-Assisted Chemical Etching of Degenerately Doped Silicon Nanowires," *Nanotechnology*, 23 (2012) pp. 305304-1-305304-7.

Barycka, I. et al., "Chemical Etching of (100) GaAs in a Sulphuric Acid-Hydrogen Peroxide-Water System," *Journal of Material Science*, 22 (1987) pp. 1299-1304.

Boukai, A. et al., "Silicon Nanowires as Efficient Thermoelectric Materials," *Nature*, 451 (2008) pp. 168-171.

Bryllert, T. et al., "Vertical High-Mobility Wrap-Gated InAs Nanowire Transistor," *IEEE Electron Device Letters*, 27, 5 (2006) pp. 323-325.

Chartier, C. et al., "Metal-Assisted Chemical Etching of Silicon in HF-$H_2O_2$," *Electrochimica Acta*, 53 (2008) pp. 5509-5516.

Chen, H. et al., "Wafer-Scale Synthesis of Single-Crystal Zigzag Silicon Nanowire Arrays with Controlled Turning Angles," *Nano Letters*, 10 (2010) pp. 864-868.

Chern, W. et al., "Nonlithographic Patterning and Metal-Assisted Chemical Etching for Manufacturing of Tunable Light-Emitting Silicon Nanowire Arrays," *Nano Letters*, 10 (2010) pp. 1582-1588.

Chun, I.S. et al., "Nanoscale Three Dimensional Pattern Formation in Light Emitting Porous Silicon," *Applied Physics Letters*, 92 (2008) pp. 191113-1-191113-3.

Cohen-Karni, T. et al., "Graphene and Nanowire Transistors for Cellular Interfaces and Electrical Recording," *Nano Letters*, 10 (2010) pp. 1098-1102.

DeJarld, M. et al., "Formation of High Aspect Ratio GaAs Nanostructures with Metal-Assisted Chemical Etching," *Nano Letters*, 11 (2011) pp. 5259-5263.

Gudiksen, M.S. et al., "Growth of Nanowire Superlattice Structures for Nanoscale Photonics and Electronics," *Nature*, 415 (2002) pp. 617-620.

Hochbaum, A.I. et al., "Enhanced Thermoelectric Performance of Rough Silicon Nanowires," *Nature*, 451 (2008) pp. 163-168.

Huang, Z. et al., "Metal-Assisted Chemical Etching of Silicon: A Review," *Advanced Materials*, 23 (2011) pp. 285-308.

Huang, Z. et al., "Fabrication of Silicon Nanowire Arrays with Controlled Diameter, Length, and Density," *Adv. Mater.* 19 (2007) pp. 744-748.

Kim, J. et al., "Curved Silicon Nanowires with Ribbon-like Cross Sections by Metal-Assisted Chemical Etching," *ACS Nano*, 5, 6 (2011) pp. 5242-5248.

Li, Xiuling, "Metal Assisted Chemical Etching for High Aspect Ratio Nanostructures: A Review of Characteristics and Applications in Photovoltaics," *Current Opinion in Solid State and Material Science*, 16 (2012) pp. 71-81.

Li, X. et al., "Metal-Assisted Chemical Etching in HF/$H_2O_2$ Produces Porous Silicon," *Applied Physics Letters*, 77, 16 (2000) pp. 2571-2574.

Lishan, D.G. et al., "Dry Etch Induced Damage in GaAs Investigated Using Raman Scattering Spectroscopy," *J. Vac. Sci. Technol B*, 7, 3 (1989) pp. 556-560.

Martinez, L.J. et al., "Fabrication of High Quality Factor Photonic Crystal Microcavities in InAsP/InP Membranes Combining Reactive Ion Beam Etching and Reactive Ion Etching," *J. Vac. Sci. Technol. B*, 27, 4 (2009) pp. 1801-1804.

Peng, K. et al., "Fabrication of Single-Crystalline Silicon Nanowires by Scratching a Silicon Surface with Catalytic Metal Particles," *Advanced Functional Materials*, 16 (2006) pp. 387-394.

Ping, A.T. et al., "The Effects of Reactive Ion Etching-Induced Damage on the Characteristics of Ohmic Contacts to n-Type GaN," *Journal of Electronic Materials*, 27, 4 (1998) pp. 261-265.

Rogers, J.A. et al., "Recent Progress in Soft Lithography," *Materials Today*, 8 2 (2005) pp. 50-56.

Rykaczewski, K. et al., "Maskless and Resist-Free Rapid Prototyping of Three-Dimensional Structures Through Electron Beam Induced Deposition (EBID) of Carbon in Combination with Metal-Assisted Chemical Etching (MaCE) of Silicon," *Applied Materials & Interfaces*, 2, 4 (2010) pp. 969-973.

Shin, J.C. et al., "Sub-100 nm Si Nanowire and Nano-sheet Array Formation by MacEtch Using a Non-Lithographic InAs Nanowire Mask," *Nanotechnology*, 23 (2012) pp. 1-6.

Svensson, C.P.T. et al., "Monolithic GaAs/InGap Nanowire Light Emitting Diodes on Silicon," *Nanotechnology*, 19 (2008) pp. 305201-1-305201-6.

Tsai M. et al., "Efficiency Enhancement and Beam Shaping of GaN-InGaN Vertical-Injection Light-Emitting Diodes via High-Aspect-Ratio Nanorod Arrays," *IEEE Photonics Technology Letters*, 21, 4 (2009) pp. 257-259.

Tsakalakos, L. et al., "Silicon Nanowire Solar Cells," *Applied Physics Letters*, 91 (2007) pp. 233117-1-233117-3.

Wallentin, J. et al., "InP Nanowire Array Solar Cells Achieving 13.8% Efficiency by Exceeding the Ray Optics Limit," *Science*, 339 (2013) pp. 1057-1060.

Yan, H. et al., "Programmable Nanowire Circuits for Nanoprocessors," *Nature*, 470 (2011) pp. 240-244.

Yan, R. et al., "Nanowire Photonics," *Nature Photonics*, 3 (2009) pp. 569-576.

Yasukawa, Y. et al., "Site-Selective Chemical Etching of GaAs Through a Combination of Self-Organized Spheres and Silver Particles as Etching Catalyst," *Electrochemistry Communications*, 10 (2008) pp. 757-760.

Yasukawa, Y. et al., "Site-Selective Metal Patterning/Metal-Assisted Chemical Etching on GaAs Substrate Through Colloidal Crystal Templating," *Journal of the Electrochemical Society*, 156, 10 (2009) pp. H777-H781.

Yu, K. et al., "Enhancing Solar Cell Efficiencies Through 1-D Nanostructures," *Nanoscale Res. Lett.*, 4 (2009) pp. 1-10.

Zhang, M.L. et al., "Preparation of Large-Area Uniform Silicon Nanowires Arrays through Metal-Assisted Chemical Etching," *J. Phys. Chem. C* 112, (2008) pp. 4444-4450.

\* cited by examiner

US 8,951,430 B2

METAL ASSISTED CHEMICAL ETCHING TO PRODUCE III-V SEMICONDUCTOR NANOSTRUCTURES

RELATED APPLICATIONS

This application claims priority under 35 U.S.C. §119(e) to U.S. Provisional Application No. 61/625,905, "METAL ASSISTED CHEMICAL ETCHING TO PRODUCE III-V SEMICONDUCTOR NANOSTRUCTURES," filed Apr. 18, 2012, the entire contents of which are incorporated by reference.

FEDERALLY FUNDED RESEARCH OR DEVELOPMENT

The invention described herein was made with government support under contract number CMMI0749028 awarded by the National Science Foundation. The U.S. Government has certain rights in this invention.

TECHNICAL FIELD

The present disclosure is related generally to etching semiconducting materials and more particularly to metal-assisted chemical etching to form nanostructures.

BACKGROUND

Nanostructures formed from semiconducting materials are becoming more prevalent. Many different fabrication methods can be used to produce nanostructures, but they generally have not been able to offer complete control over the pattern and quality of the nanostructures in an affordable and timely manner. One of the most popular methods is reactive ion etching of a patterned substrate. However, this can result in intense damage to the crystal structure and surface morphology. Since many semiconducting applications are very sensitive to defects within the material, it is important to reduce them whenever possible. One method which is becoming increasingly used is metal-assisted chemical etching (MacEtch).

Metal-assisted chemical etching offers a method of etching silicon by patterning a silicon surface with a layer of metal. The metal acts as a catalyst for etching the silicon surface directly beneath it when exposed to an oxidizing agent (e.g., $H_2O_2$) and an acid (e.g., HF). Metal assisted chemical etching can produce nanowires of high aspect ratios in silicon (e.g., see U.S. Patent Application Publication 2011/0263119, which is hereby incorporated by reference in its entirety). Since it is a wet etch, MacEtch can easily be done in large quantities for a low price compared to popular dry etch methods that may require a vacuum or plasma. Also, the ability to make structures that are undamaged in any shape capable of being patterned with metal (e.g., gold) has made MacEtch a viable method of silicon nanowire fabrication.

However, MacEtch of other materials, such as III-V materials to produce periodic nanostructures, has hardly been explored and has not been effective in producing high aspect ratio nanostructures.

BRIEF SUMMARY

A method of forming high aspect ratio semiconductor nanostructures, such as III-V nanostructures, is provided. The nanostructures can be used in many applications including solar cells, light emitting diodes (LEDs), laser diodes (LDs) such as distributed feedback (DFB) lasers and distributed Bragg reflector (DBR) lasers, detectors, field effect transistors (FETs), thermoelectric devices, sensors such as along biological interfaces, and nanoscale processing units.

According to one embodiment, the method includes providing an electrically conductive film pattern disposed on a semiconductor substrate comprising a III-V semiconductor. The method further includes selectively removing at least a portion of the III-V semiconductor immediately below the conductive film pattern by immersing the electrically conductive film pattern and the semiconductor substrate into an etchant solution comprising an acid and an oxidizing agent having an oxidation potential less than an oxidation potential of hydrogen peroxide. The III-V semiconductor may include gallium arsenide and the III-V semiconductor may or may not be doped.

In another embodiment, the method of metal assisted chemical etching includes providing a conductive film pattern disposed on a semiconductor substrate comprising a III-V semiconductor, and selectively removing at least a portion of the III-V semiconductor immediately below the conductive film pattern by immersing the conductive film pattern and the semiconductor substrate into an etchant solution comprising an acid and an oxidizing agent, wherein a molar ratio of a concentration of the oxidizing agent in the etchant solution to a concentration of the acid in the etchant solution is from about $10^{-2}$ to about $10^{-7}$.

BRIEF DESCRIPTION OF THE DRAWINGS

FIG. 10b shows a high magnification image obtained from the top surface of one n-type GaAs pillar after the MacEtch process. No voids or porous surface features were observed, indicating that structural damage is not induced during MacEtch under the specified conditions and that the original crystal structure of the n-type GaAs substrate may be preserved;

FIG. 14c shows a low magnification image of the same samples, demonstrating that uniform MacEtch can occur over extended substrate areas leadings to identical pillar geometries throughout the sample;

FIGS. 21a-20c are (a) schematic representation of the MOCVD grown superlattice heterostructure consisting of a 6 period GaAs/In$_{0.5}$Ga$_{0.5}$As stack on a GaAs substrate. (b) 45° tilted-view SEM image obtained from the GaAs/InGaAs sample after the MacEtch procedure. Etching occurs along the Au-coated regions, consistent with the MacEtch mechanism. Pillar-like structures were produced with heights of approximately 1 µm and diameters of roughly 550 nm, corresponding to the diameter of the polystyrene spheres after an oxygen plasma reactive ion etching (RIE) process. (c) high-magnification SEM image of the MacEtch produced pillars along the regions containing the superlattice heterostructure, demonstrating successful MacEtch of both binary GaAs and ternary In$_{0.5}$Ga$_{0.5}$As semiconductor compounds.

DETAILED DESCRIPTION

Figure 1:
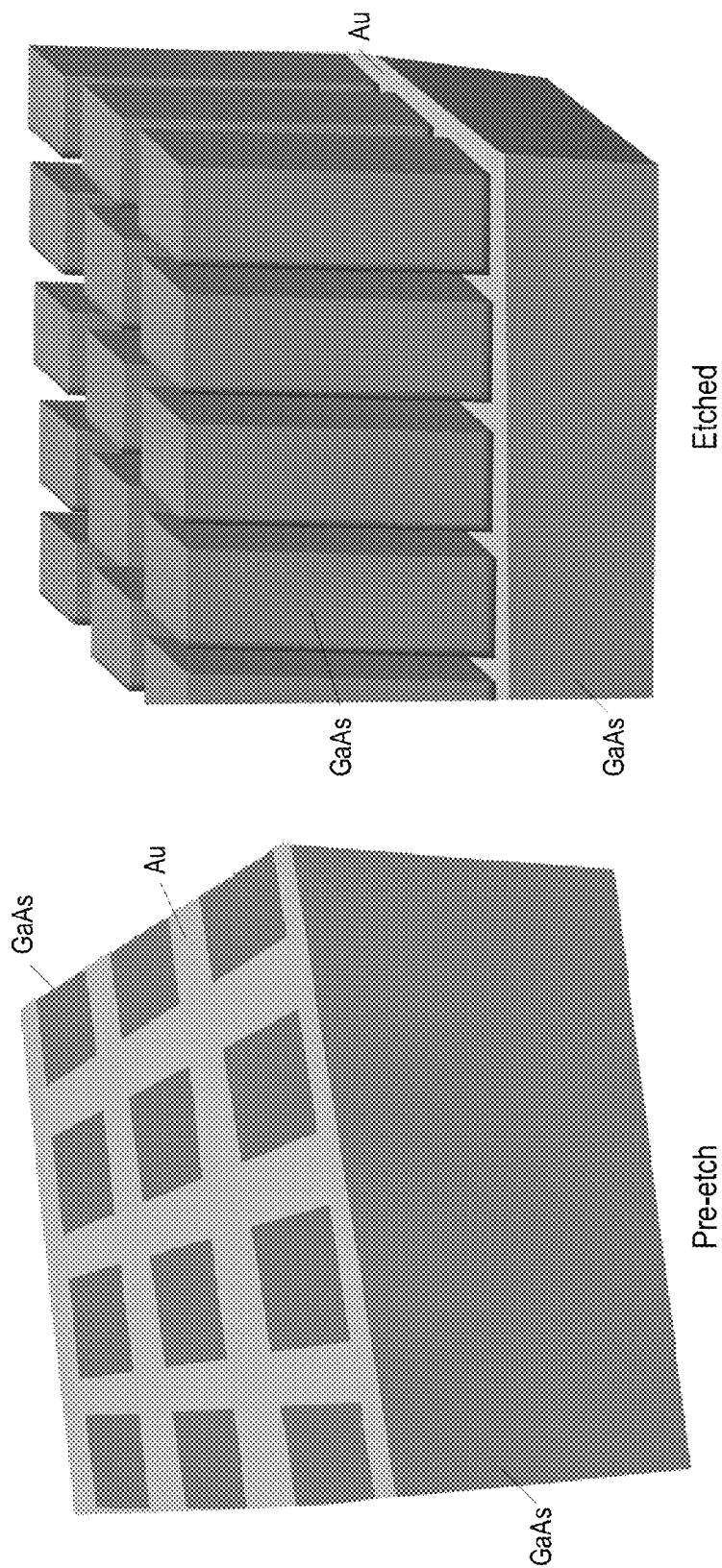
FIG. 1 is a schematic illustrating gold deposited in a pattern which etches the GaAs directly below it when introduced to a solution with an acid (e.g., HF and $H_2SO_4$) and an oxidizing agent (e.g., $KMnO_4$ and $K_2S_2O_8$) to form nanopillar patterns with diameters such as 0.2, 0.4, 0.6, 0.8, and 1.0 μm.

Methods of etching semiconductors such as III-V semiconductors to form semiconducting structures with nanometer dimensions are described herein. Etched arrays of III-V nanostructures can offer a variety of advantages over silicon because of the ability to create direct band gap, ternary, and heterostructure materials. In certain examples described below, periodic, high aspect ratio GaAs nanopillars are formed with lateral dimensions (e.g., widths or diameters) in the range of about 10 to about 1000 nm or about 500 to about 1000 nm by an etching method that may be referred to as metal assisted chemical etching (MacEtch). When overlaid with a metal (e.g., gold) pattern and exposed to an acidic environment with a suitable oxidizing agent, the GaAs directly underneath the metal pattern etches. A metal assisted chemical etching process had previously been proven for silicon, but prior to this work, such a method had not been successfully applied to III-V semiconductors.

The methods described herein are capable of creating high quality nanowire arrays quickly in III-V semiconductors such as GaAs, InAs, GaP, InP, InGaAs and InGaP. Different nanowire morphologies are observed depending on the reactants dissolved in the solution and their relative concentrations. The ratio of the reactants, as discussed further below, can greatly affect the morphology and topography of the produced nanostructures. Depending on the etchant concentration and etching temperature, GaAs nanowires with either vertical or undulating sidewalls may be formed. Etch rates may be from about 1 µm/min to about 2 µm/min.

Metal assisted chemical etching of III-V material may be achieved under the conditions described below when a III-V semiconducting material is covered with a layer of metal such as gold having a specific pattern. A variety of different methods can be used to pattern the material prior to etching, such as S4 stamping (described in WO 2011/049804), polystyrene spheres, and metal deposition masks. When the III-V material with the metal pattern is introduced to a suitable etching solution, as described below, the III-V material directly beneath the metal may be removed, and areas not covered with metal may remain. The depth of the removed features depends on the etching time; thus it is possible to create structures of patterned III-V semiconductors having high aspect ratios.

A common method for creating high aspect ratio structures on the surface of III-V materials is dry etching. However, dry etching involves bombardment of the semiconductor surface with charged ions. The bombardment is damaging to the crystal lattice and thus the side walls of the etched structures can be full of defects. Damage within the crystal structure severely hinders a material's transport and optical properties, and induces traps and recombination centers that may hinder carrier movement and thus device efficiency. In contrast, MacEtch is a wet etch process that does not involve high energy ions. Therefore, it does not create structural defects in the material. MacEtch of III-V material retains the original crystal structure of the semiconductor and does not damage the crystal structure.

According to one embodiment, the etching method may include providing an electrically conductive film pattern disposed on a semiconductor substrate comprising a III-V semiconductor. At least a portion of the III-V semiconductor immediately below the conductive film pattern is selectively removed by immersing the electrically conductive film pattern and the semiconductor substrate into an etchant solution comprising an acid and an oxidizing agent having an oxidation potential less than an oxidation potential of hydrogen peroxide.

In another embodiment, the etching method may include providing a conductive film pattern disposed on a semiconductor substrate comprising a III-V semiconductor. At least a portion of the III-V semiconductor immediately below the conductive film pattern is selectively removed by immersing the conductive film pattern and the semiconductor substrate into an etchant solution comprising an acid and an oxidizing agent. A molar ratio of a concentration of the oxidizing agent in the etchant solution to a concentration of the acid in the etchant solution is from about $10^{-2}$ to about $10^{-7}$.

The conductive film pattern can act as a catalyst for etching such that the etchant solution does not remove substantial portions of the III-V semiconductor which do not have the conductive film pattern disposed thereon. The conductive film can be a single layer of metal (e.g., Au, Ag, Pt, Pd), alloy (e.g. Ti/Au) or a stack of metal (e.g., Pd/Au, Ti/Au, Au/Ni/Au, Au/Fe/Au). The semiconductor substrate can be or include a III-V semiconductor (e.g., GaAs). The III-V semiconductor can be doped such as doped p-type or n-type, or the III-V semiconductor can be semi-insulating, intrinsic or non-doped.

The etchant solution may be selected so that it does not remove substantial portions of the III-V semiconductor which do not have the conductive film pattern disposed thereon. For instance, the etchant solution may not etch the III-V semiconductor without the presence of the conductive film pattern disposed thereon.

In some embodiments, the oxidizing agent may have an oxidation potential less than an oxidation potential of hydrogen peroxide, which is about 1.8 V. For example, the oxidizing agent may include potassium permanganate ($KMnO_4$), which has an oxidation potential of about 1.7 V. The oxidizing agent may also or alternatively include potassium persulfate ($K_2S_2O_8$). Although the oxidation potential of $K_2S_2O_8$ (about 2.0 V) is higher than that of hydrogen peroxide, it may have a sufficiently slow oxidation rate at low concentrations to allow it to be used for etching.

A concentration of the oxidizing agent in the etchant solution can be in a range of about 1 and about 30 mM, about 20 and about 150 mM, or in a range of about 50 and 100 mM. The concentration of the oxidizing agent may even be varied during etching while the electrically conductive film pattern and the semiconductor substrate are in the etchant solution. The acid may be selected from the group consisting of sulfuric acid ($H_2SO_4$) and hydrofluoric acid (HF).

In contrast to silicon, the III-V semiconductors investigated here can be effectively etched by relatively weak oxidants at low molar concentrations. A molar ratio of the concentration of the oxidizing agent in the etchant solution to the concentration of the acid in the etchant solution may be from about $10^{-2}$ to about $10^{-7}$ or from about $10^{-5}$ to about $10^{-7}$.

As further explained below, temperature can have a significant effect on the etching. In some methods, the selectively removing the portion of the III-V semiconductor takes place at a temperature from about 0° C. to about 60° C., at a temperature from about 40° C. to about 45° C., or a temperature at about room temperature. The length of time in the etchant solution can depend on desired etch depth. For example, the conductive film pattern and the semiconductor substrate may be immersed in the etchant solution for about 1 to about 30 minutes or about 3 to about 5 minutes.

Such methods can be used to form features in the semiconductor substrate having a length-to-width aspect ratio of at least about 5:1, thereby forming an array of high aspect ratio semiconductor nanostructures.

Furthermore, as described above, the methods described herein can be used to form electronic devices such as LEDs, solar cells, Bragg reflector. For example, the semiconductor substrate can comprise a first layer, a base substrate, and a second layer sandwiched between the first layer and the base substrate. The first layer can comprise a p-type or an n-type III-V semiconductor, the second layer can comprise a SI-type III-V semiconductor, and the base substrate can comprise a p-type or an n-type III-V semiconductor opposite to that of the first layer. For example, the p-type III-V semiconductor can be p-GaAs, the n-type III-V semiconductor can be n-GaAs, and the SI-type III-V semiconductor can be SI-GaAs or InGaAs. The selectively removing at least a portion of the III-V semiconductor can include selectively removing adjacent portions of the first and second layers and the base substrate to form a trench extending through the first and second layers and partially into the base substrate. More than one trench may be formed during etching. For example, a plurality of intersecting trenches or a mesh structure may be formed.

The method can further include at least partially filling the one or more trenches with an electrically insulating material. The electrically insulating material may extend from the bottom of the trench(es) to a level that meets some portion of the first layer, such that the second layer and the base substrate are not visible within the trench(es). The electrically insulating material can be an oxide or polymer such as photopolymer SU-8-2.

The method can further include depositing an electrically conductive material onto an unetched portion (or portions) of the first layer. The electrically conductive material can be optically transparent such as being transparent in a visible range. For example, the electrically conductive material can be an electrically conductive transparent oxide such as indium tin oxide (ITO).

As described above, the semiconductor substrate can be patterned so that etching of the semiconductor substrate removes selective portions of the semiconductor substrate and leaves substantially unetched regions. For example, an electrically conductive film pattern having a mesh structure may used to create trenches having an intersecting configuration during etching, such that unetched regions comprising columns or pillars of various shapes and sizes (e.g., sub-100 nm sizes) are defined. For example, in the case of a heterostructure, a column or pillar comprising the first layer, the second layer and the base substrate can be formed to have a nanometer scale width, thereby forming a quantum well.

Furthermore, the semiconductor substrate can include more than two layers on a base substrate. For example, a stack of a plurality of p-i-n structures can be etched through to form a feature having the plurality of p-i-n structures.

n-GaAs Examples

Described below are examples of the etching characteristics of n-GaAs wafers patterned with gold as a function of oxidizing agents and acidic solutions. Specifically, the differences between the structures etched on the surface of GaAs from different solutions containing HF, $H_2SO_4$, potassium permanganate, and/or potassium persulfate are described.

For the GaAs samples of the present disclosure, sulfuric acid ($H_2SO_4$) and/or hydrofluoric acid (HF) may be used as the acidic hydrogen donor for the MacEtch process. Instead of $H_2O_2$ for the oxidizing agent, potassium permanganate ($KMnO_4$) and/or potassium persulfate ($K_2S_2O_8$) can be used. $KMnO_4$ may be advantageous due to its lower oxidation potential. In order to perform metal assisted chemical etching, these agents are able to produce holes ($h^+$) in the gold. Sulfuric acid has already been proven as a sufficient method to etch (100) GaAs by producing holes ($h^+$) in the substrate by means of $H_2O_2$ as an oxidizing agent. A similar process occurs in metal assisted chemical etching, except the production of holes is facilitated by the gold catalyst. The oxidizing agents produce holes at the cathode, which is the gold. The cathode reaction occurs as follows:

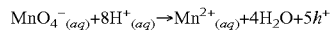

$$MnO_4^-{}_{(aq)} + 8H^+{}_{(aq)} \rightarrow Mn^{2+}{}_{(aq)} + 4H_2O + 5h^+$$

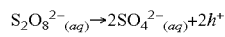

$$S_2O_8^{2-}{}_{(aq)} \rightarrow 2SO_4^{2-}{}_{(aq)} + 2h^+$$

These holes can then diffuse into the substrate, forming $Ga^{3+}$ and $As^{5+}$ or $As^{3+}$. The oxidized gallium and arsenic can dissolve into the solution at any interface not covered by gold. The holes diffuse to this interface for this reaction to occur. Once in the solution, arsenic has the potential to form orthoarsenic acid ($AsH_3O_4$). If controlled properly, the oxidized GaAs can dissociate into the solution directly near the edge of the gold, forming high aspect ratio structures, as illustrated in FIG. 1. As such, the reaction process of the method can include generating holes ($h^+$) from the oxidizing agent on the conductive film pattern, diffusing the holes ($h^+$) to a boundary of the conductive film pattern, III-V semiconductor, and etchant solution, and then removing the holes ($h^+$) from the semiconductor substrate substantially immediately upon the holes ($h^+$) reaching the boundary.

The n-type GaAs samples described herein were initially prepared on a quarter of a purchased n-type GaAs wafer. These wafers were then cut into many smaller pieces to allow for multiple trials. The GaAs wafers used were (100) interface with a doping of $N_d = 2 \times 10^{18}$ cm$^{-3}$. Two different patterns were used for the GaAs MacEtch. The larger of the two patterns includes 0.3 mm×0.3 mm squares while the others are nanowire arrays of 1.0, 0.6, and 0.4 μm. The pattern, schematically illustrated in FIG. 1, was formed by lithography of photoresist AZ5214. The nanowire array was patterned by soft lithography with liftoff. A 20 nm gold metal film was deposited using a CHA e-beam evaporator.

The samples were individually subjected to a different etching solution that included deionized water (DI), $H_2SO_4$ or HF, and $KMnO_4$ or $K_2S_2O_8$. All of the square patterned samples were subjected to 30 mL HF and 15 mL DI for a duration of 3 minutes with varying concentrations of oxidizing agent. During etching, the acid and oxidizing agent concentrations were kept stable within a range that typically varied between 15 and 30 mL of acid with 0 to 15 mL of DI water. The hydrofluoric acid used was 49% by mass purchased from J. T. Baker. Since both of the oxidizing agents are solid reagents, they were mixed in the solution of HF:DI for five minutes prior to adding the GaAs sample. When both oxidizing agents were in the concentration at the same time, $KMnO_4$ was always added first. All the GaAs samples were analyzed and measured using a Hitachi S4800 SEM.

Large Pattern Etching Examples

Larger square patterns on GaAs were used to compare the effect of an increasing concentration of oxidizing agent at a constant volume of HF and DI. The oxidizing agent was increased three different ways: (1) by increasing the amount of $KMnO_4$ with no $K_2S_2O_8$ present (FIG. 2a-d), (2) increasing the amount of $KMnO_4$ with 0.755±0.005 g $K_2S_2O_8$ always present (FIG. 2e-h), and (3) increasing the amount of $K_2S_2O_8$ with 0.265±0.005 g $KMnO_4$ always present (FIG. 2i-l). The samples were measured on two parameters: (1) the vertical etch depth, and (2) the length of horizontal side etching.

Figure 2:
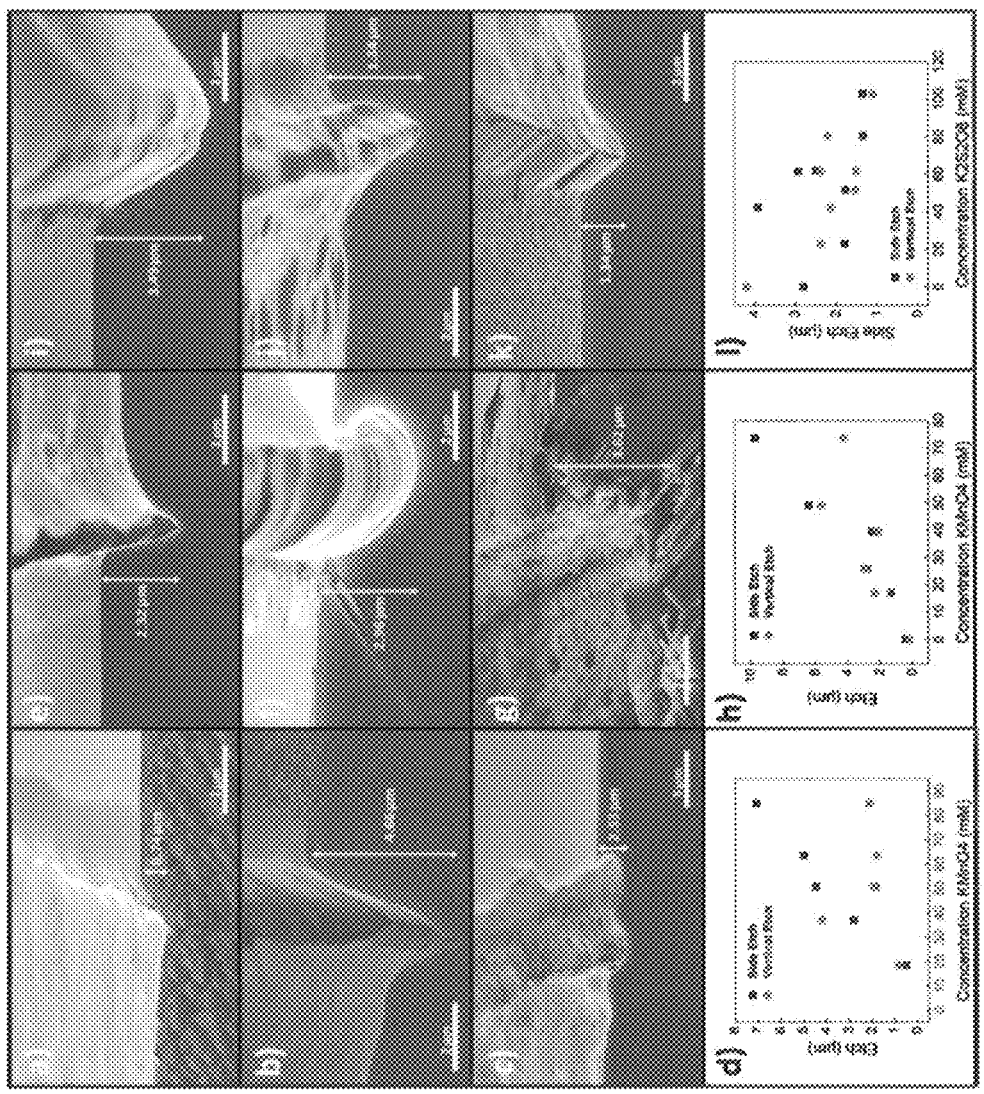
FIGS. 2a-2l are (a-c, e-g, and i-k) scanning electron microscope (SEM) micrographs and (d, h, and l) plots of concentration of $K_2S_2O_8$ as a function of etch depth (μm) for large square patterns subject to a solution of 30 mL HF and 15 mL DI with dissolved potassium persulfate or potassium permanganate or both for three minutes where (a-d) only potassium permanganate was dissolved for concentrations ranging between 18.5 mM and 85 mM, (e-h) both potassium permanganate and potassium persulfate were dissolved in the solution and the persulfate concentration remained constant at 62 mM while the permanganate concentration varied between 0 mM and 73.7 mM, and (i-l) the permanganate concentration was kept constant at 37.3 mM while the persulfate concentration varied between 0 mM and 103 mM.

As observed in FIGS. 2a-2l, in most of the examples, horizontal side etching of considerable length was observed, sometimes exceeding the length of the vertical etch. The vertical and side etches used for the plots in FIGS. 2d, 2h, and 2l were calculated by measuring multiple squares along the same sample and taking the standard mean. Both FIG. 2d and FIG. 2h examine how the vertical and side etching changes with increasing $KMnO_4$ concentration. Without any persulfate present, the vertical etching depth peaks at around 4.2 μm at a concentration of 37.1 mM $KMnO_4$ (FIG. 2b). This concentration also had the best aspect ratio. There is still some side etching even at low concentrations of 18.5 mM $KMnO_4$ (FIG. 2a). This indicates that a low concentration over a long period of time may not provide the best structure. As the amount of permanganate increased, the vertical etching dropped to a depth near 2 μm consistently after peaking. However, the horizontal side etch continues to increase in what appears to be a linear relationship with oxidant concentration. At 85 mM $KMnO_4$ (FIG. 2c) the horizontal etch seems to be primarily the result of excess holes produced during the MacEtch process. Had the GaAs been etched by the solution itself in a manner similar to $H_2SO_4$ and $H_2O_2$, the surface of the GaAs should show some deformation. However, the top of the GaAs square is undamaged, and the edge has the shape of an overhang. If this was due to etching from a solution this overhang should not occur because the edge itself should provide more surfaces for etching. However the area between the gold and the square is very rough with visible indents and crevices.

Similarly, the horizontal side etch was observed to increase linearly with increasing $KMnO_4$ when $K_2S_2O_8$ was kept constant at 62 mM $K_2S_2O_8$. As shown in FIG. 2b, the vertical etch depth peaked at 49 mM $KMnO_4$. However, at 49 mM $KMnO_4$, the GaAs square became damaged and showed signs of being etched by the solution itself. For example, FIG. 2g shows the results of 73.7 mM $KMnO_4$. The area to the left is actually the area that is covered with gold and the square area, on the right, had been severely etched. Much like the other example, the surface is extremely rough and has a rocky interface at high concentrations of $KMnO_4$. The other two images of this example, FIG. 2e and FIG. 2f, are 17 mM and 26 mM $KMnO_4$, respectively. In FIG. 2f, the area covered by the gold is at the same height as GaAs surface, but in FIG. 2e the gold covered surface is noticeably depleted. For FIG. 2f, metal assisted chemical etching appeared to have occurred only in the gold closest to the interface. As the etching continued, the gold rotated the etch around the edge. It is possible that with large gold patterns, the concentration of oxidizing agent can affect what regions of GaAs form holes, with areas near the interface being more favorable.

Increasing potassium persulfate resulted in a decrease in both vertical and side etching. At 103 mM $K_2S_2O_8$ (FIG. 2k), the surface of the GaAs square showed signs of etching for all exposed GaAs. This is evident by the rough surface in FIG. 2k. This is not unusual since potassium persulfate has a higher oxidation potential than both potassium permanganate and $H_2O_2$. FIG. 2i and FIG. 2j (42 mM and 81 mM $K_2S_2O_8$, respectively) both show signs of vacancy formation within the substrate. Along the tip of the GaAs square in FIG. 2i, there is a clearly defined row of vacancies. The vacancies formed at the higher concentration in FIG. 2j are smaller and closer packed. These defects are visually similar to the defects observed in hole formation in GaAs from $H_2O_2$ and $H_2SO_4$. However, since they only occur near the edge of the square near the gold, the source of these holes are from the MacEtch process and not the solution itself. While most of these vacancies are visible at the surface, a few can be observed below the surface in both FIG. 2i and FIG. 2j. It is possible that enough holes were created from MacEtch that as they diffused through the GaAs, and there was not enough surface area to dissolve into the solution. Therefore, it became more favorable to form a positive vacancy. When observing the square at higher magnification, a ring of these defects can easily be noticed with undamaged GaAs in the middle. At higher concentrations, the width of the ring was larger and the amount of GaAs in the center decreased.

Similar surface defects occur in the other two examples as well. While none of them formed vacancies beneath the surface, there were similar surface morphologies evident only near the GaAs gold interface. Both FIG. 2a and FIG. 2e have slight ridges observable close to the edge of the square. It appears that GaAs was etched away at this interface similar to the etching along the sides. However, since most of the holes had already dissociated into the solution before then, only a small amount was able to diffuse that far, resulting in a very slight etch. At higher oxidizing concentration, a strip of rough surface deformation appears in FIG. 2b and along the edge of the square in FIG. 2f. This roughness was likely formed in the same manner as the vacancies in FIG. 2i and FIG. 2j. Additionally, vacancies could be responsible for rough surfaces noticed at high concentrations of $KMnO_4$. The trials with the highest concentration of oxidizing agent will have the most holes diffusing through the substrate. It is possible that these vacancies are abundant enough for pieces to break off and form the facetted surfaces observed in FIG. 2c and FIG. 2g.

Nanowire Formation Examples

While silicon has already been able to form nanowires by metal assisted chemical etching with much success, it has yet to be proven for III-V materials. Using the perforated patterns mentioned above (such as in regard to FIG. 1) and the etching solutions mentioned above, nanowires were able to be etched in GaAs with varying degrees of success depending on etching parameters.

Figure 3:
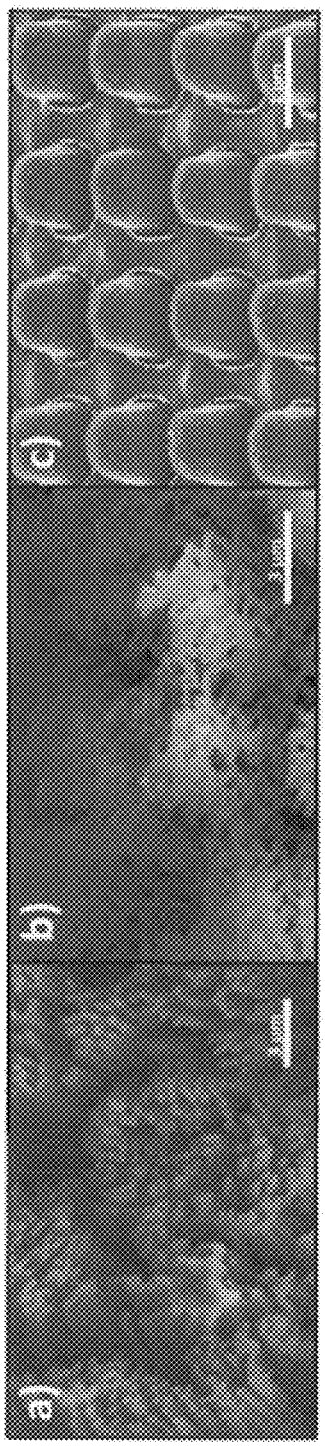
FIGS. 3a-3c are SEM micrographs showing how slight variations in potassium permanganate concentration resulted in different types of nanowires (a) at a concentration of 54.8 mM the wires were etched relatively slight with slight undulating curvature along the length of the wire, (b) at a concentration of 55.7 mM caused the wires to undulate even more forming a zigzag shape as they were etched, and (c) at a concentration of 58.2 mM, only small bumps were formed.

With a solution of only $KMnO_4$ and HF, nanowires of different morphologies were observed at distinct $KMnO_4$:HF concentrations (FIGS. 3a-3c). The concentrations of 54.8 mM, 55.7 mM, and 58.2 mM $KMnO_4$ for FIGS. 3a-3c, respectively, refer to a solution of 15 mL HF and 0 mL DI with the etch occurring for 5 minutes. Small amounts of DI were added in an attempt to increase uniformity but did not show significant improvement. For solutions with DI, as long as mole ratio of HF to $KMnO_4$ remained the same the nanowire morphology stayed consistent.

Also, these examples were done in a 30 mL Pyrex container with a 32 mm diameter. The HF reacted with the $SiO_2$ and $B_2O_3$ to dilute the solution. However, the examples done in the Pyrex glass were more consistent than those done in the plastic container.

As observed in FIGS. 3a-3c, the molarities of the three wires were close to each other with a range of only 3.4 mM $KMnO_4$. This corresponds to only 0.008 grams of $KMnO_4$ in a 15 mL solution which is a small window. An interesting attribute of the nanowires formed form this solution is that they had a distinctive zigzag shape, as shown in FIG. 3b. When introduced to the solution, the gold initially etched the wire at an angle. However, after etching this way for a certain distance the wire began to etch in the opposite direction. The width of the zigzag from one turning point to the other varied with tiny changes in $KMnO_4$ concentration.

However, some wires obtained were fairly smooth as observed in FIG. 3a. These wires still had zigzag properties, but much less so than FIG. 3b. It would appear that as concentration of $KMnO_4$ decreases the shape becomes smoother while, at a higher concentration of 58.2 mM $KMnO_4$ only small bumps were etched. The bumps appeared vertically straight and uniform. Even though these bumps do not have a large amount of tapering, the tops of them appear to be etched off completely.

Figure 4:
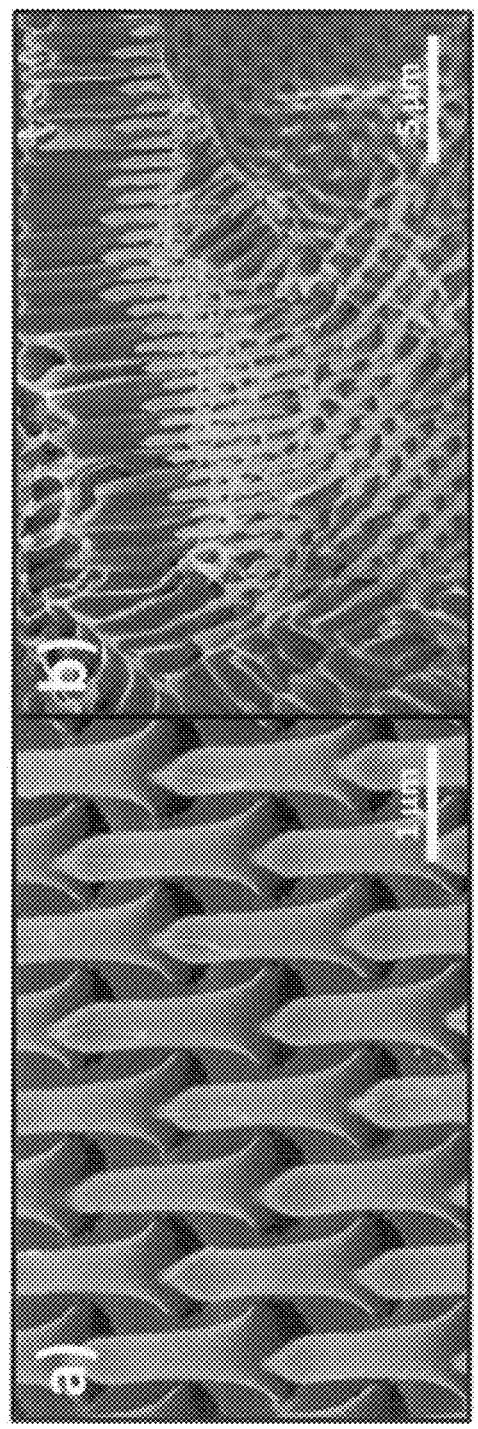
FIGS. 4a-4b are SEM micrographs of nanowires etched with a solution of 15 mL HF and 15 mL DI, the concentrations of $K_2S_2O_8$ and $KMnO_4$ were 92 mM and 56 mM, respectively; the SEM micrographs showing (1) only the base of the nanowire remained thick enough after etching, and the tips become so thin that they form small extensions on the top of the base, (2) a nanowires whose tips were not etched thin can be seen near the center, (3) in some areas during the etching the gold pattern broke creating uneven areas across the surface, and the nanowires formed in these areas were etched perpendicular with respect to the angled surface.

Nanostructures were observed using other solutions as well. FIGS. 4a-4b show the results of nanowires formed by etching in a solution of 15 mL of HF, 15 mL of DI, 92 mM of $K_2S_2O_8$ and 56 mM of $KMnO_4$ for 5 minutes. The morphology of these wires is vastly different from the wires formed with only $KMnO_4$. As shown FIG. 4a, these wires are somewhat tapered with diagonal facets on the top of each one. Also, there is a very thin strand of material that falls down above the wire. This thin strand used to be part of the wire, but due to excessive etching it was reduced to a very thin strand. This signifies the actual depth of the etch being much deeper than the nanowires themselves. This excessive etching could be due to etching from the solution itself, as observed in FIG. 2k, or as part of the MacEtch process. During etching, it is not uncommon for some connections of gold to tear or break. The etch rate is different along these areas because of the change in surface area. This can creates multiple levels of height along the surface, as seen in FIG. 4b. However, the wires observed were able to etch in multiple directions even though the crystal directions were not the same. FIG. 4b shows wires being etched in three different directions according to the angle of the surface beneath them.

A small chuck of gold was placed in the solution during the $K_2S_2O_8$ and $KMnO_4$ etch. By producing an additional surface for oxidation to occur, the small chunk of gold essentially reduced the effect of the oxidizing agent. Without the piece of gold, the side etch was too extensive and only miniature spikes were etched out of the GaAs substrate.

Figure 5:
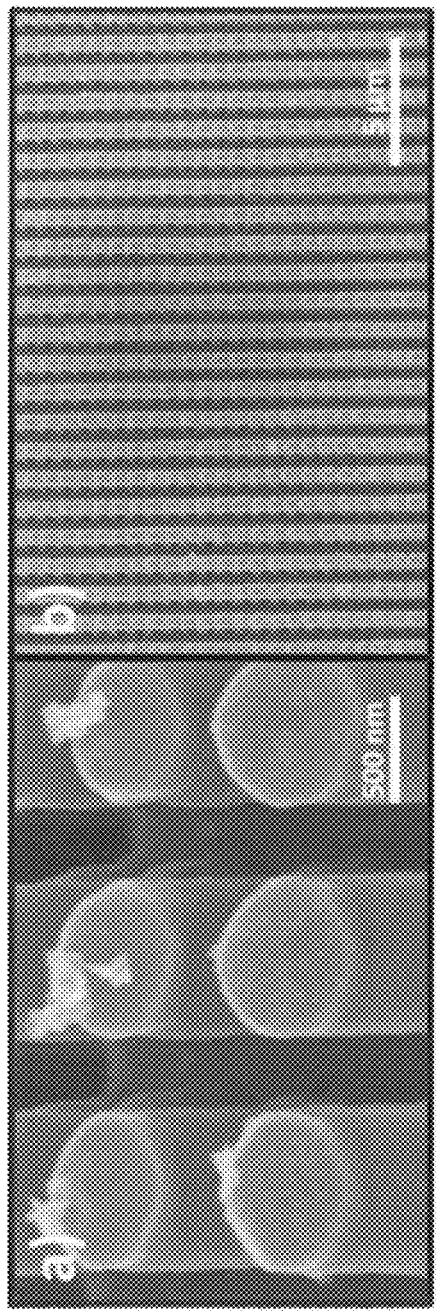
FIGS. 5a-5b are SEM micrographs of high aspect ratio nanowires etched using sulfuric acid and potassium permanganate with a solution of 15 ml $H_2SO_4$, 30 mL DI, and 0.150 M $KMnO_4$ showing (a) in some areas there was little to no side etching with the top of the wire retaining a spherical shape, and (b) wires were etched with much uniformity across the sample.

Even better nanowires were formed with sulfuric acid and potassium permanganate, as shown FIGS. 5a-5b. The wires in FIG. 5a exhibit very little side etching and retain a flat circular top. However, the wires varied somewhat over the sample and not all of the wires were this perfect. Some have more tapering or side etching than others, but over the sample, the wires are fairly uniform (FIG. 5b). Unfortunately, these wires are very sensitive to the kinetics of mixing the solution and are very difficult to repeat. The solution which produced the nanowires observed in FIGS. 5a-5b included 15 mL of HF, 30 mL of DI, and 1.06 g of $KMnO_4$, which is about 150 mM $KMnO_4$. With such a high amount of potassium permanganate, not all of it could dissolve into the solution and the undissolved solute remained on the bottom of the beaker during the etch. The GaAs sample was etched for 3 minutes with the temperature of the solution being between 42 and 45° C. The nanowires etched with sulfuric acid exhibited the best morphologies out of the above three different solutions, but were the least reproducible.

By adapting metal-assisted chemical etching methods to GaAs, nanoscale structures can be successfully etched into substrates. Similar methods can be used to etch through other heterostructure III-V material. By exploiting the effect different acids and oxidizing agents have on the etching process, different nanostructures can be formed for a variety of applications, including nanowires of multiple morphologies, with zigzag shapes and along angled interfaces.

Regardless of the type of the semiconductor, an ideal MacEtch solution is substantially inert without the presence of metal. Although $H_2O_2$ has been proven to be a suitable MacEtch agent for silicon, it has been shown to etch (100) GaAs in either acidic or base solution without the presence of metal catalyst. MacEtch of III-V material can be performed by using appropriate etching conditions resulting in the highest differential etch rate for the III-V semiconductors, where differential etch rate refers to the difference in the etch rate with and without metal present. Oxidizing agents with weaker oxidation potentials (e.g., $KMnO_4$) can be used to prevent nonmetal-catalyzed etching, while maintaining a reasonable etch rate in the presence of metal.

Described below is additional discussion of how the parameters of the MacEtch process can be selected for different III-V materials. Also described are additional etching characteristics of n-type GaAs wafers patterned by gold using soft lithography and etched with $KMnO_4$ as the oxidizing agent in acidic ($H_2SO_4$ or HF) solutions. Of interest is the influence of solution concentration and temperature on the etching characteristics.

DISCUSSION AND ADDITIONAL EXAMPLES

As described above and further below, ordered arrays of high aspect ratio GaAs nanostructures have been formed using Au-MacEtch. In the below additional MacEtch examples, Epi-ready Si-doped (100) GaAs substrates acquired from AXT, Inc. with a doping concentration of $1 \times 10^{18}$ to $4 \times 10^{18}$ $cm^3$ were used for MacEtch. Potassium permanganate ($KMnO_4$), an oxidizing agent that has an oxidation potential lower than that of $H_2O_2$ (see Table I), was mixed with deionized water (DI) and either sulfuric acid ($H_2SO_4$) or hydrofluoric acid (HF). The overall etching of GaAs using $KMnO_4$ can be described by the following chemical reaction: $GaAs + MnO_4^- + H^+ \rightarrow Ga^{3+} + As^{n+} + Mn^{2+} + H_2O$, with n equal to 3 or 5. In MacEtch, the metal catalyst acts as the cathode and the semiconductor acts as the anode. Table I lists relevant half reactions involving chemical species used for etching, as well as possible products and participating reactants in the overall reaction. Several possible products of the etching reaction with mass and charge balanced are listed in Table II. The etching was carried out at either room temperature or at 30 to 45° C. for a period of 3 to 5 min, as indicated below. No stirring was done during etching.

TABLE II

Half-cell electrochemical potentials.

| | $E°/V$ |
|---|---|
| Anode Reaction | |
| Gallium | |
| $Ga \rightarrow Ga^{3+} + 3e^-$ | 0.549 |
| $Ga \rightarrow Ga^+ + e^-$ | 0.2 |
| $Ga + H_2O \rightarrow GaOH^{2+} + H^+ + 3e^-$ | 0.498 |
| $Ga + 4OH^- \rightarrow H_2GaO_3^- + H_2O + 3e^-$ | 1.219 |
| Arsenic | |
| $As + 3H^+ + 3e^- \rightarrow AsH_3$ | −0.608 |
| $2As + 3H_2O \rightarrow As_2O_3 + 6H^+ + 6e^-$ | −0.234 |
| $As + 2H_2O \rightarrow HAsO_2 + 3H^+ + 3e^-$ | −0.248 |
| $HAsO_2 + 2H_2O \rightarrow H_3AsO_4 + 2H^+ + 2e^-$ | −0.560 |
| $As + 4OH^- \rightarrow AsO_2^- + 2H_2O + 3e^-$ | 0.68 |
| $AsO_2^- + 4OH^- \rightarrow AsO_4^{3-} + 2H_2O + 2e^-$ | 0.71 |
| Silicon | |
| $Si + 6F^- \rightarrow SiF_6^{2-} + 4e^-$ | 1.24 |
| $Si + H_2O \rightarrow SiO + 2H^+ + 2e^-$ | 0.8 |
| $Si + 2H_2O \rightarrow SiO_2 (quartz) + 4H^+ + 4e^-$ | −0.857 |
| $Si + 6OH^- \rightarrow SiO_3^{2-} + 3H_2O + 4e^-$ | 1.697 |
| Cathode Reaction | |
| $MnO_4^- + 8H^+ + 5e^- \rightarrow Mn^{2+} + 4H_2O$ | 1.507 |
| $MnO_4^- + 4H^+ + 3e^- \rightarrow MnO_2 + 2H_2O$ | 1.679 |
| $H_2O_2 + 2H^+ + 2e^- \rightarrow 2H_2O$ | 1.776 |
| $S_2O_8^{2-} + 2H^+ + 2e^- \rightarrow 2HSO_4^-$ | 2.123 |
| Gold | |
| $Au^+ + e^- \rightarrow Au$ | 1.692 |
| $Au^{3+} + 2e^- \rightarrow Au^+$ | 1.401 |
| $Au^{3+} + 3e^- \rightarrow Au$ | 1.498 |
| $Au^{2+} + e^- \rightarrow Au^+$ | 1.8 |
| Overall Reaction | |
| $GaAs + MnO_4^- + H^+ \rightarrow Ga^{3+} + As^{3+} + Mn^{2+} + H_2O$ | |
| Overall reaction with possible forms of the products (balanced) | |
| $GaAs + 2KMnO_4 + H_2O + 5HF \rightarrow HAsO_2 + GaF_3 \cdot 3H_2O + 2MnO_2 + 2KF$ | |
| $3GaAs + 8KMnO_4 + 17HF + 5H_2O \rightarrow 3H_3AsO_4 + 3(GaF_3 \cdot 3H_2O) + 8MnO_2 + 8KF$ | |
| $10GaAs + 12KMnO_4 + 33H_2SO_4 \rightarrow 10HAsO_2 + 12MnSO_4 + 6K_2SO_4 + 5Ga_2(SO_4)_3 + 28H_2O$ | |
| $10GaAs + 16KMnO_4 + 39H_2SO_4 \rightarrow 10H_3AsO_4 + 16MnSO_4 + K_2SO_4 + 5Ga_2(SO_4)_3 + 24H_2O$ | |

Nanoscale gold mesh patterns, with hole size ranging between 500 and 1000 nm, were prepared using a soft lithography method. First, a layer of $SiN_x$ was deposited on top of the GaAs, followed by a spin-coated layer of SU8 resist. Using a poly-(methyl methacrylate) (PMMA) stamp, the pattern was imprinted onto the SU8. Next the depressed SU8 was removed using an oxygen plasma etch. The sample was then subject to a $CHF_4$ etch to remove the exposed $SiN_x$. Following this step, a 20 nm layer of Au was evaporated on the GaAs surface. Native oxide on GaAs was removed using (HCL: DI=1:1) solution just before evaporating Au. The remaining $SiN_x$ and SU8 were removed with sonication in a diluted HF solution. Also tested were micrometer square patterns of 300×300 µm² separated by 125 µm wide strips of gold formed with standard optical lithography using AZ5214 photoresist. SEM images were obtained using a Hitachi 4800 microscope and photoluminescence (PL) spectra were measured using a Renishaw micro-PL system with a 633 nm pump laser and a CCD detector at room temperature.

As mentioned above, MacEtch begins when holes (h⁺) are generated from the oxidant on the metal surface and then diffuse to the semiconductor. The holes (h⁺) can then subsequently be consumed by oxidizing the semiconductor directly underneath the metal to form soluble product in the acidic solution. This leads to vertical etching. Alternatively, the holes can diffuse outside of the metal-semiconductor interface to areas around the metal to induce lateral etching. The aspect ratio of a produced structure is inherently related to the proportion of vertical to lateral etching, which is the essence of the MacEtch mechanism. Processing factors that affect the dynamics of MacEtch can be classified into three categories: (1) semiconductor type and doping; (2) metal type, feature size, and density; and (3) solution components, concentration, temperature, and local concentration fluctuation. The examples herein focused on parameters of the third factor that limits aspect ratios, e.g., the solution. In particular, the effect was explored of oxidizing agent potential and concentration, chemical end product, accessibility to solution as a result of metal pattern size, and temperature on the etching dynamics and aspect ratio of GaAs nanostructures produced by this method.

Figure 6:
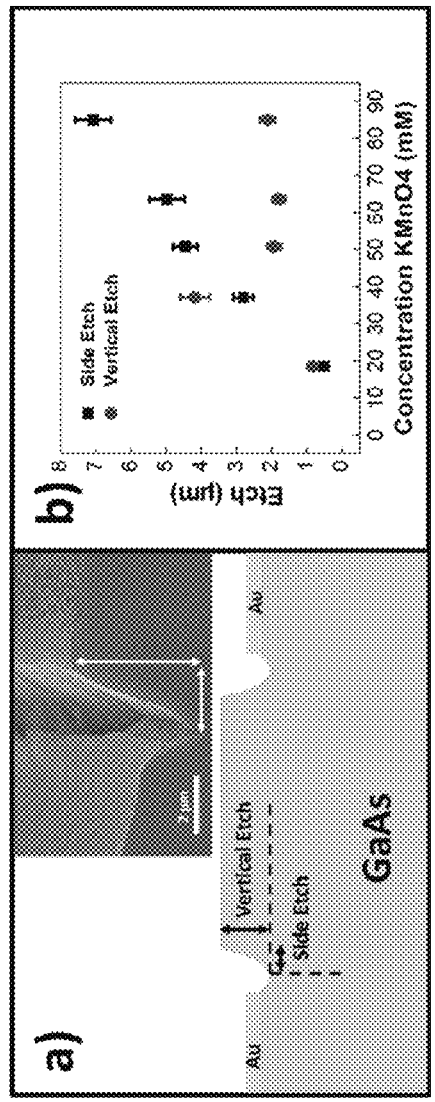
FIGS. 6a-6b are (a) schematic illustrations of a typical etched profile defined by vertical and side etch at the pattern edges with inset showing the SEM image of FIG. 2b of such profile and (b) a plot of $KMnO_4$ concentration as a function of vertical and size etch depth of FIG. 2d which show effect of oxidant concentration on vertical and side etch of GaAs using a 300×300 µm² large square gold mesh pattern that was etched in a solution of $KMnO_4$ and HF for 3 min.

In order to produce high aspect ratio structures, lateral etching should be suppressed. FIGS. 6a-6b present the effect of the oxidant concentration on the etching direction by using large size gold mesh patterns (300×300 µm² separated by 125 µm). For metal patterns of such a large size, etching takes place mostly around the edges of the metal pattern, while areas under the middle of the metal pads have limited access to solution which prevents product removal. Accumulated holes from the metal covered areas tend to diffuse laterally and side etch occurs. FIG. 6a is a schematic illustration of the typical topography produced from patterns of this size as well as the SEM image of FIG. 2b showing the trenched profiles. The trenched etching structures are measured on two parameters: vertical etch depth and side (lateral) etch length.

FIG. 6b is the plot of FIG. 2d which shows the effect of the concentration of oxidizing agent $KMnO_4$ on the vertical versus side etch rate. The vertical and side etching depths are plotted using the average depth measured over multiple squares on the same sample, and the standard deviation is plotted as the error bar. It can be seen that as $KMnO_4$ concentration increases, the vertical etch depth peaks at a concentration of 37 mM and then drops to a relatively stable value. This concentration also exhibits the best aspect ratio (vertical/side etch depth) of the examples. Further increase in concentration causes the side etch rate to surpass the vertical etch rate, as more holes are produced at higher concentrations of $KMnO_4$. In order to form completely ordered structures with vertical sidewalls, the dissolution step of MacEtch reaction should to be uniform across the patterned area.

Note that patterns of hundreds of micrometers were used to evaluate side etch. If the side etch is larger than the radius of the nanostructure's lateral dimension, the etching will result in polishing with no discernible structure formation. Due to the difference in the supply of holes ($h^+$) for oxidation and end product removal rate, the selection of the parameters of etching recipe varies as a function of metal pattern size and connectivity. MacEtch of GaAs at nanoscale dimensions was found to be sensitive to all etching parameters. For gold mesh patterns at submicrometer scales, most combinations of oxidant to acid ratio, dilution, and temperature resulted in either no etching or polishing from overetching. A suitable etching condition is determined by calibrating between the two extremes.

Figure 7:
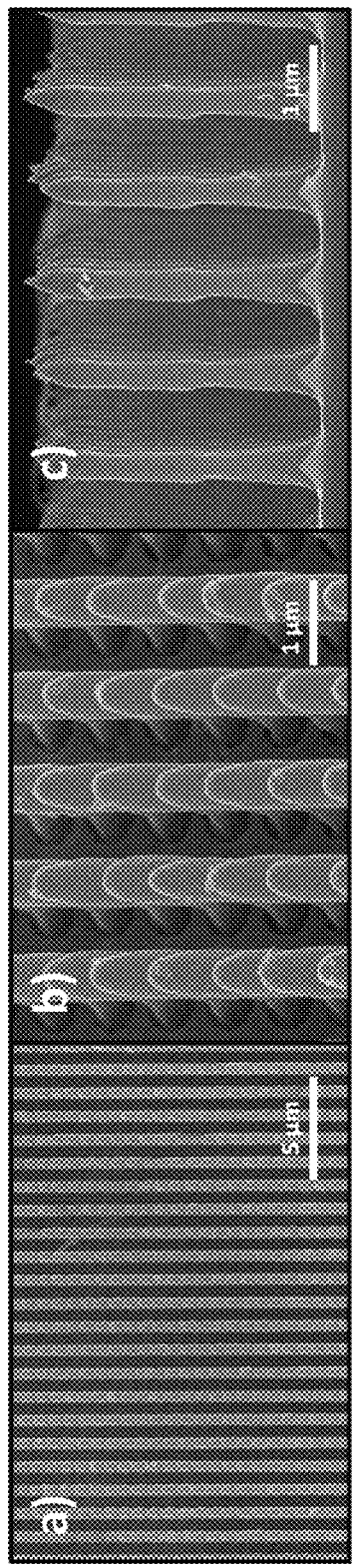
FIGS. 7a-7c are SEM images of high aspect ratio GaAs nanopillars produced from a 600 nm wide square gold mesh pattern in $H_2SO_4$ and $KMnO_4$ solution at 40 to 45° C. showing (a) 30° tilted view at low magnification, (b) 30° tilted view at high magnification, and (c) cross-sectional showing the highly vertical nanopillar array.

FIGS. 7a-7c are SEM micrographs of an array of highly vertical GaAs nanopillars produced from a gold mesh pattern with 600 nm diameter openings in a solution of $H_2SO_4$ oversaturated with $KMnO_4$ at slightly elevated temperature for 5 min. The nanopillars formed are about 3.5 μm tall and about 600 nm in width. The gold mesh pattern descends to the bottom of the pillar structure and can be seen clearly in FIG. 7b, similar as is the case for silicon MacEtch. The tips of the nanopillars appear to be tapered, probably resulting from lateral etching at the initial stage. Slight nonuniformity in the pillar width can be seen in the cross-sectional SEM image near half height of the wire. However, the position of the narrow neck appears to be synchronized for all pillars, implying that this is due to local etchant concentration fluctuations in the solution. Nevertheless, large area periodic arrays of ordered GaAs nanopillars are produced using MacEtch in a matter of minutes. The solution was kept between 40 and 45° C. during etching. Note that using the same solution, no etching was observed at room temperature, while at temperatures higher than 45° C., the gold pattern delaminated from the substrate surface.

Without being bound by theory, it is hypothesized that at this temperature, the etching reaction is dissolution limited. The rate-determining step is the removal of the oxidized $Ga^{3+}$ and $As^{n+}$ ($n=3^+$ or $5^+$) into solution (e.g., $Ga_2(SO_4)_3$ and $HAsO_2$). As a result, the holes ($h^+$) generated at the gold surface are not consumed in time and instead diffuse laterally to promote etching of the bare GaAs. Similar reverse MacEtch was reported for InP under photoirradiation. In that case, the above bandgap photons generate electrons and holes in the bare InP area; the electrons then diffuse and recombine with the holes generated from metal-catalyzed oxidant reduction in the metal-covered area causing holes to accumulate and etch the bare InP region. These results indicate that etching temperature can affect the dynamics of carrier diffusion, oxidation, and product removal, all of which effect the spatial profile of GaAs structures generated by patterned MacEtch.

Figure 8:
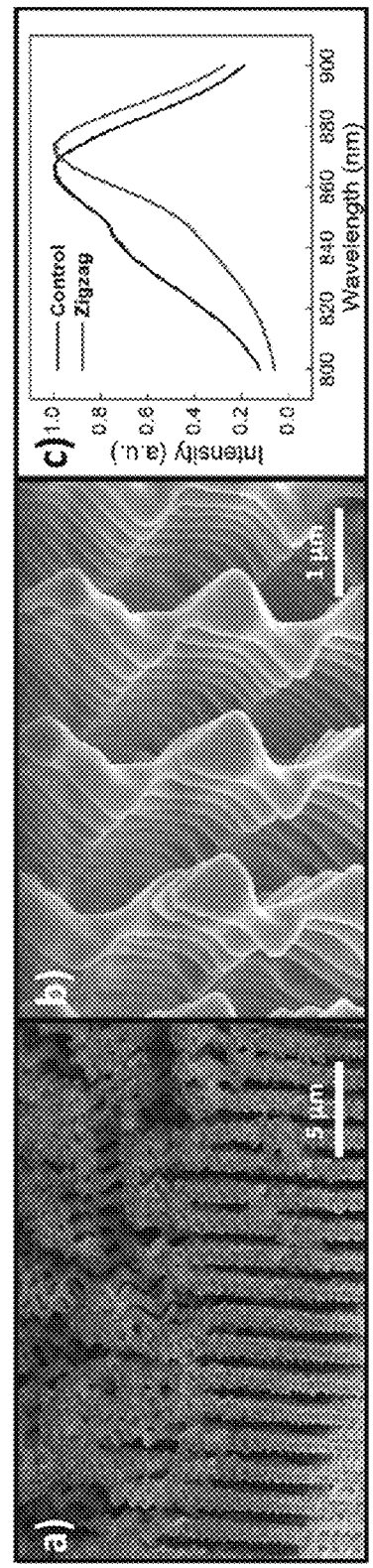
FIGS. 8a-8c are (a and b) cross-sectional view SEM images of an array of zigzagging GaAs nanowires at (a) low and (b) high magnifications formed from MacEtch using 1 µm wide square gold mesh pattern at 55.7 mM concentration of $KMnO_4$ in HF solution carried out in a glass beaker showing the tips of the nanowires are clumped together due to surface tension when the wires are tall, and (c) a room temperature photoluminescence (PL) spectra taken from the zigzagged GaAs nanowires along with an unetched area of the GaAs substrate (control) where the peaks are at 870 and 880 nm, respectively.

Furthermore, striking zigzagging high aspect ratio nanowires are formed by MacEtch using a solution of $KMnO_4$ and HF in a glass beaker at room temperature. Shown in FIGS. 8a-8b is an array of wires with zigzagging sidewalls formed from a 1.0 μm diameter mesh pattern etched using 55.7 mM of $KMnO_4$ in HF for 5 min. From the zoomed in side image of FIG. 8b, the zigzag pattern can be seen to be synchronized horizontally. Also, the twisting direction is close to <111> crystal orientation based on measured angles from the SEM images. MacEtch can propagate along different orientations with different etchant concentration, and high HF/oxidant ratio prefers etching along <111> directions for Si (100) substrate (Chem, W.; Hsu, K.; Chun, I. S.; de Azeredo, B. P.; Ahmed, N.; Kim, K. H.; Zuo, J. M.; Fang, N.; Ferreira, P.; Li, X. L. Nano Lett. 2010, 10, 1582-1588). Without being bound by theory, it is believed that concentration modulation is the reason for the observed zigzagging GaAs nanowires which twist left and right from one <111> orientation to another, joined by the straight <100> segments.

It has been reported that zigzag silicon nanowires were formed using (111) Si wafers through MacEtch with solution-based gold catalyst $AgNO_3$ (Chen, H.; Wang, H.; Zhang, X.-H.; Lee, C.-S.; Lee, S.-T. Nano Lett. 2010, 10, 864-868). Notably, an intentionally scratched rough surface led to zigzag, while polished smooth surface yielded straight wires. In another report (Kim, J.; Kim, Y. H.; Choi, S.-H.; Lee, W. ACS Nano 2011, 5, 5242-5248), an initial porous silicon layer was deemed important for the formation of zigzag Si nanowires for Si(100) surface using patterned gold mesh as catalyst at an elevated temperature (60° C.). The porous layer acted as a barrier to deter diffusion of MacEtch reactants in the unstirred solution, creating high and low concentrations as reactants were consumed because there was a delay in replenishing them. The zigzag morphology was also believed to be attributed to the concentration variations.

For GaAs, intentional surface roughening did not produce zigzagging structures. However, carrying out the reaction in a glass container with HF acid produced the zigzag morphology while other container materials did not, implying that the borosilicate glass container participated in the etching reaction. Without being bound by theory, it is hypothesized that the glass surrounding the solution is constantly turning HF into $H_2O$, which creates a concentration gradient that drives the diffusion of HF directly above the semiconductor wafer piece toward the container walls. In competition with the outward diffusion, HF is consumed from reacting with GaAs during MacEtch, causing the diffusion to shift back toward the wafer piece to rebalance the concentration. The constant modulation of flux during etching creates a periodic concentration variation similar to the zigzagging silicon nanowire etching condition reported by Kim et al. Although the borosilicate container reaction replicated an extreme case of concentration variations during etching, the resulting nanowire morphology clearly demonstrates the susceptibility of GaAs MacEtch to local solution fluctuations.

FIG. 8c is a plot of the PL spectrum taken from the zigzagged nanowires along with an unetched area on the same sample. A distinct shift toward longer wavelength by about 9 nm relative to bulk GaAs is observed for the zigzagged nanowires, and smaller (about 3 nm) red shift (not shown) has also been observed for other nanowire structures formed. The red shift might be from some shallow surface states which become more prevalent for nanowires due to the increased surface area.

Figure 9:
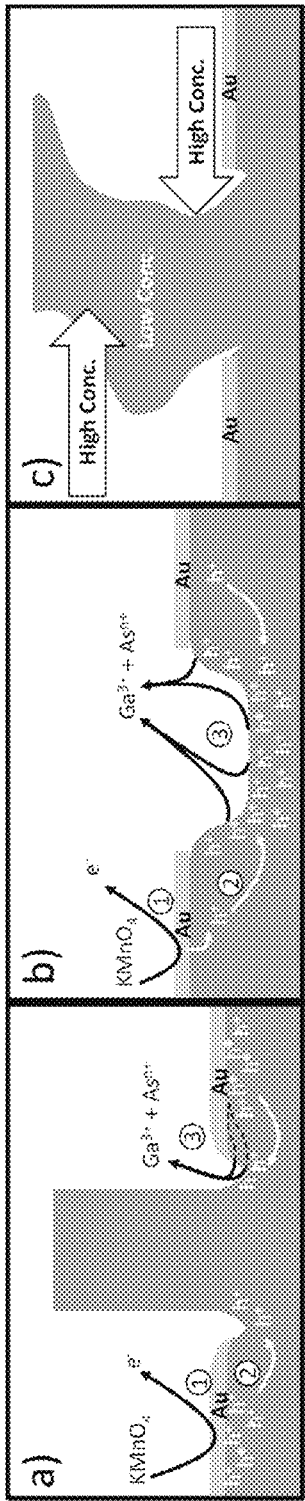
FIGS. 9a-9c are schematic illustrations of the formation mechanism of morphologies observed, where the etching process involves the competition of three steps: (1) hole ($h^+$) generation from $KMnO_4$ catalyzed by gold surface; (2) hole ($h^+$) diffusion; and (3) oxidation and removal of etching products ($Ga^{3+}$ and $As^{n+}$, where n=3 or 5)

FIGS. 9a-9c are schematic illustrations of the formation mechanism of the GaAs nanostructures discussed above. Three processes labeled 1, 2, and 3 correspond to the three steps in MacEtch: hole formation, hole diffusion, and semiconductor oxidation and removal. FIG. 9a corresponds to MacEtch involving $H_2SO_4$ at high temperature (40 to 45° C.), where the holes are removed as soon as they reach the boundary of Au, GaAs, and solution. This scenario results in high aspect ratio vertical wall nanopillars, as shown in FIGS. 7a-7c. FIG. 9b represents MacEtch involving $H_2SO_4$ at mid-temperature range (30 to 35° C.), where there is an excess amount of holes accumulates in the bare GaAs area because the lower temperature severely reduces the rate of step 3. This mechanism leads to reverse MacEtch where metal acts as a mask. FIG. 9c illustrates the scenario of FIGS. 8a-8c, where MacEtch involves local concentration fluctuation induced by consumption and rebalance of $HF/KMnO_4$ by the boroslicate glass. The concentration modulation forces the nanowires to exhibit a zigzag morphology.

By adapting the etching solution to GaAs, the MacEtch process, a wet but directional etching method, has been demonstrated to produce high aspect ratio semiconductor nanoscale structures beyond just silicon. In contrast to MacEtch of silicon, the process window for GaAs is more sensitive to the rate of oxidation with and without the gold catalyst and rate of dissolution for etching product removal, as well as to changes in the local concentration during etching. By exploiting the effect of etching parameters, different nanostructures can be formed for a variety of applications, including DBR or DFB lasers, photonic crystals, LEDs with periodic roughening surfaces, and solar cells with light trapping nanostructures. Since the etching takes place at a temperature near room temperature, no metal contaminants should be incorporated in the core of the nanopillars, and surface contamination can be removed. Because there is no high energy ions involved, as in the case of dry etching, surface damage should not be a concern. Because the aspect ratio is essentially limited by etching time, as long as unassisted etching mechanism such as side etching can be suppressed, extremely high aspect ratio vertical structures can be generated. Although only n-type GaAs is demonstrated here, using teachings disclosed herein, etching parameters can be selected for MacEtch to work for other III-V materials of various doping types and levels as well as heterostructures. The realization of high aspect ratio III-V nanostructure arrays by MacEtch can potentially transform the fabrication of a variety of optoelectronic device structures including DBR and DFB semiconductor lasers, where surface grating is currently fabricated by dry etching. It also brings affordability and possibly new device concepts for III-V nanostructure based photonic devices.

n-GaAs, SI-GaAs, p-GaAs Compositions and Devices

MacEtch was performed on GaAs (100) substrates with three different doping types: semi-insulating (SI), Si-doped (n=~1–3×10$^{18}$ cm$^{-3}$), and Zn-doped (p=1×10$^{18}$ cm$^{-3}$). After native oxide removal in a dilute HCl solution, a 35 Å Au-layer was deposited on the GaAs substrates via electron-beam evaporation, followed by soft-lithography patterning of gold to pattern various devices. MacEtch was performed in a solution including deionized water (DI), 49% hydrofluoric acid (HF) as the etching agent, and potassium permanganate ($KMnO_4$) as the oxidizing agent. Scanning electron microscopy (SEM) was performed using a Hitachi S-4800 microscope and photoluminescence (PL) spectra were obtained through the use of a Renishaw in Via μ-PL system at room temperature with excitation provided by laser emission centered at 633 nm.

Figure 10:
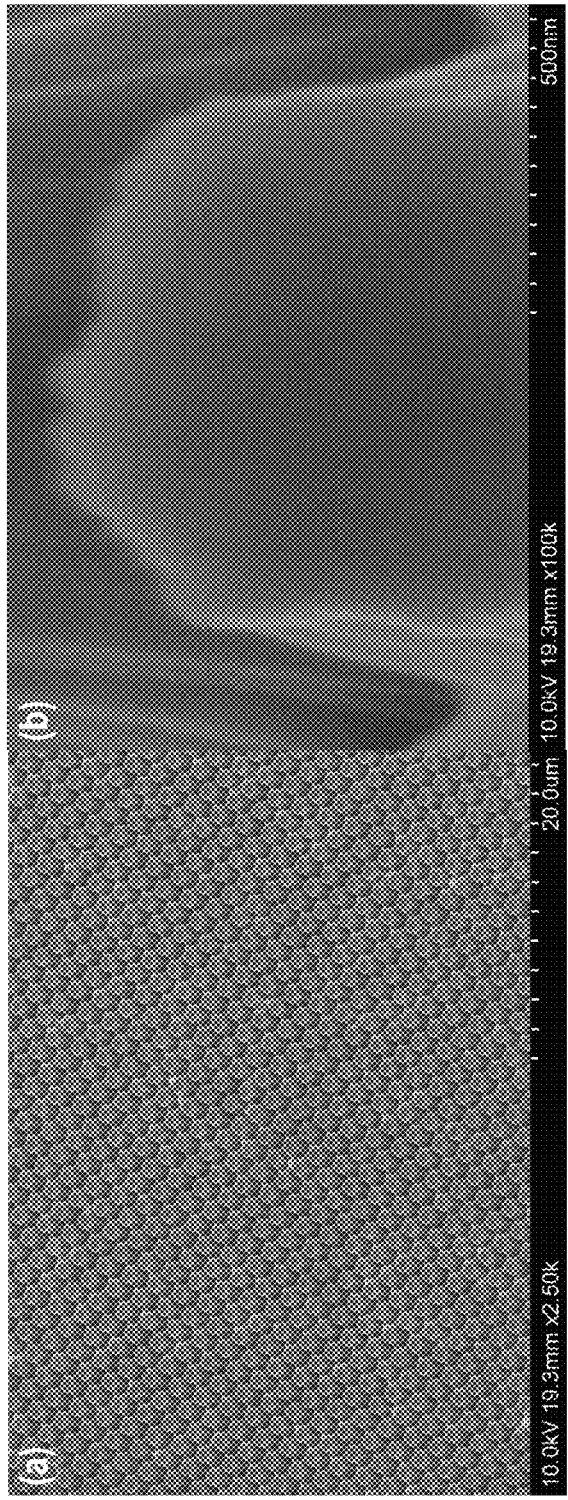
FIGS. 10a-10b are SEM micrographs of n-type GaAs nanopillars. MacEtch was performed at room temperature for a period of 10 minutes in a solution consisting of 20 mL of HF, 10 mL of deionized $H_2O$, and 0.05 g of $KMnO_4$.
Figure 11:
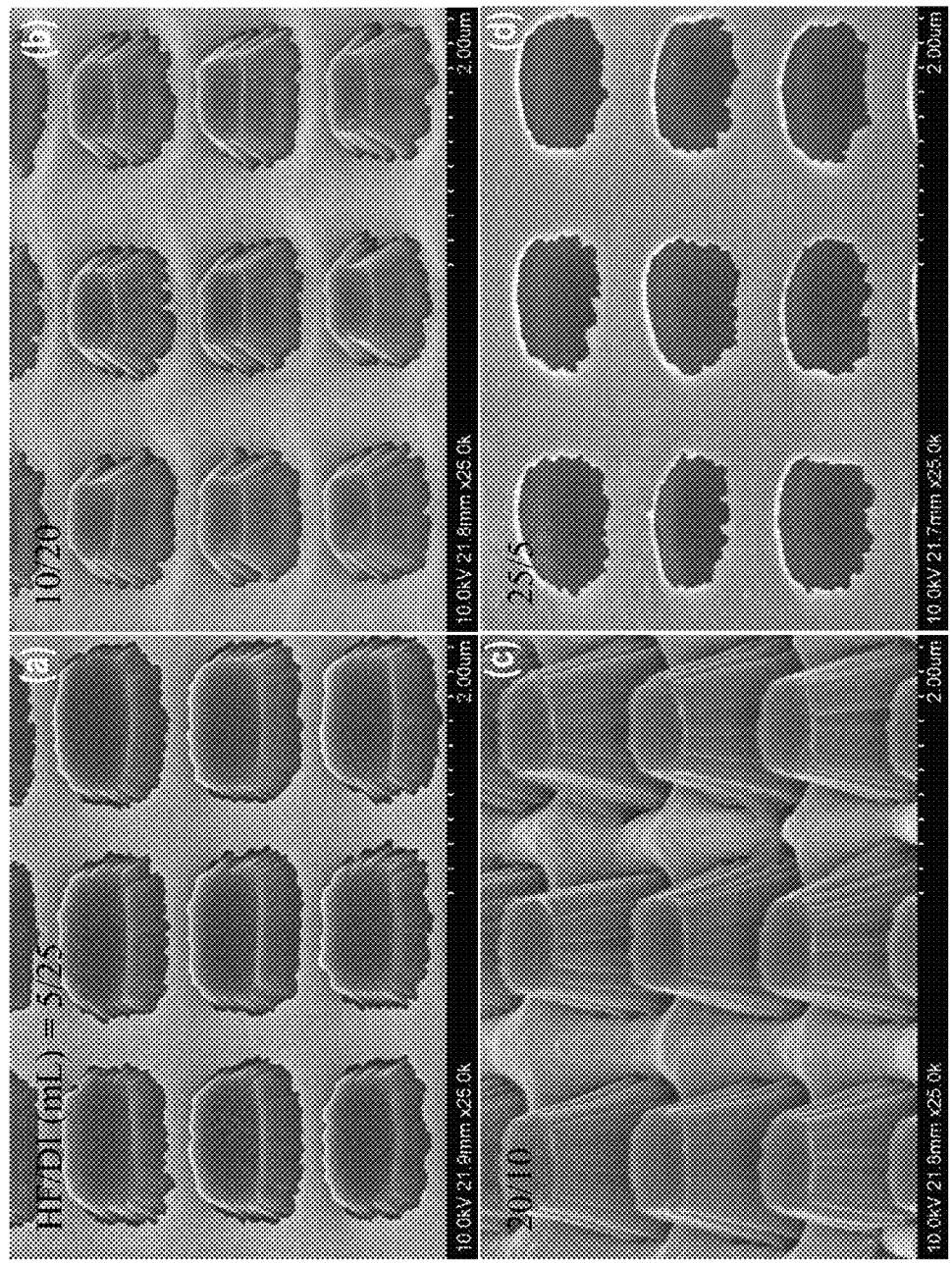
FIGS. 11a-11d are SEM micrographs of etched semi-insulating GaAs (SI-GaAs) samples. Pillar morphologies and etch rates may be tuned as a function of the MacEtch solution composition. The volumetric ratio of HF to deionized water (DI) may be varied within the range of (a) 5:25 to (d) 25:5. Etch periods and $KMnO_4$ concentrations were kept constant at 10 minutes and 0.05 g, respectively. A maximum etch rate of roughly 160 nm per minute occurs at an HF:DI ratio of 20:10, in the case of SI-GaAs MacEtch for the quoted oxidant concentration. Lower dilution levels (HF:DI=25:5) results in the quenching of vertical etching, indicating the significance of the role of DI as a surfactant.

FIG. 10a is a SEM micrograph of an array of n-type GaAs nanopillars showing a substantially uniform structure over a relatively large area. FIG. 10b is a SEM micrograph of one of the GaAs nanopillars of FIG. 10a showing no discernible porosity in the nanopillar. The GaAs nanopillars of FIGS. 10a-10b were produced from a gold pattern in a solution of 20 mL HF, 20 mL DI, 0.05 g of $KMnO_4$ at room temperature for 10 min.

FIGS. 11a-11d are SEM micrographs of semi-insulating GaAs (SI-GaAs) that was etched with a solution of (a) 5 mL HF and 25 mL DI, (b) 10 mL HF and 20 mL DI, (c) 20 mL HF and 10 mL DI, and (d) 25 mL HF and 5 mL DI, respectively. All of the solutions also include 0.05 g of $KMnO_4$. The molar concentrations and concentration ratios are provided in Table III below. Etching was conducted at a temperature of 22° C. for a duration of 10 minutes.

TABLE III

| | Molar Concentrations and Concentration Ratios | | | |
|---|---|---|---|---|
| | [HF] | [$KMnO_4$] | [HF]/[$KMnO_4$] | [$KMnO_4$]/[HF] |
| (a) | 0.14M | 7.9E−6M | 17722 | 5.6E−5 |
| (b) | 0.28M | 6.35E−6M | 44094 | 2.3E−5 |
| (c) | 0.56M | 3.17E−6M | 176656 | 5.6E−6 |
| (d) | 0.7M | 1.59E−6M | 440257 | 2.2E−6 |

Figure 12:
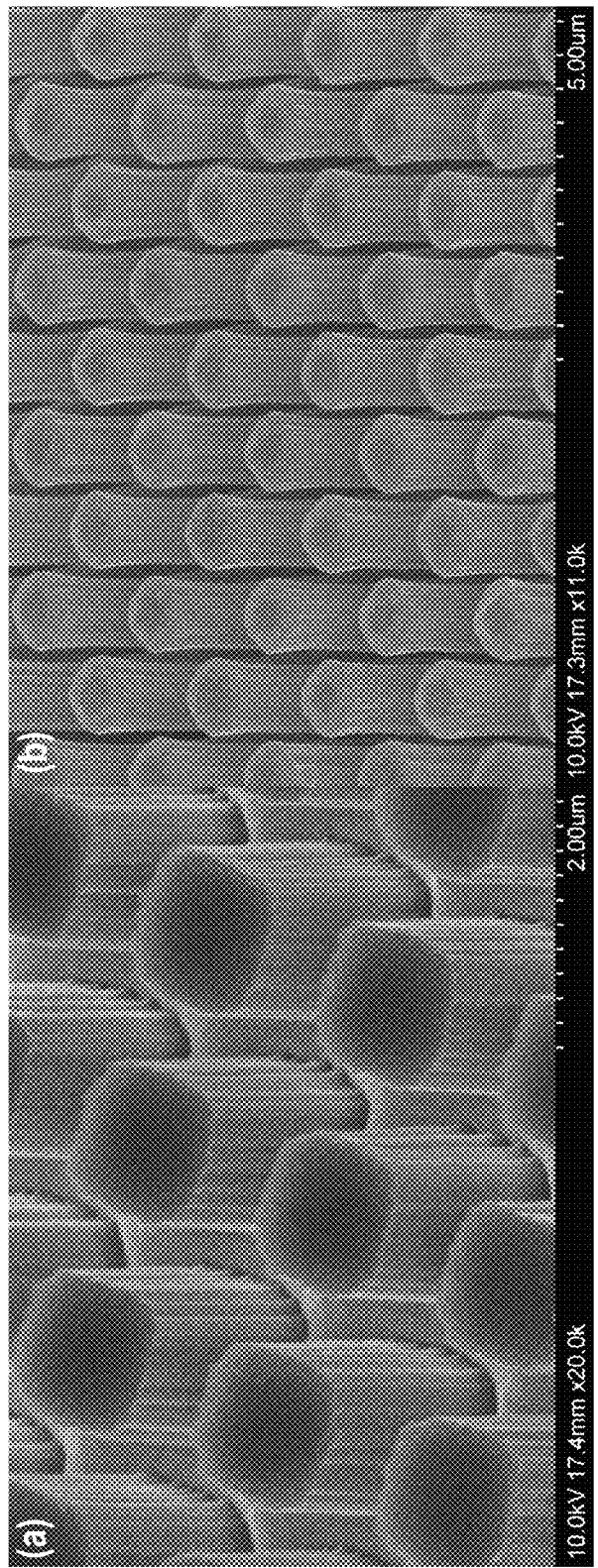
FIGS. 12a-12b are SEM micrographs of p-GaAs nanopillars. Pillars in FIG. 12a were produced in a solution consisting of 20 mL of HF, 10 mL of DI, and 0.025 g of $KMnO_4$. Pillars in FIG. 12b were produced in a MacEtch solution consisting of 20 mL of HF, 10 mL of DI, and 0.2 g of $KMnO_4$. In both cases, etching was performed for a total duration of 10 minutes at room temperature.

Samples of p-GaAs were also etched. FIGS. 12a-12b are SEM micrographs of p-GaAs that were etched in a solution of 20 mL HF and 10 mL DI for 10 minutes at a temperature of 22° C. The solution for the sample of FIG. 12a includes 0.025 g of $KMnO_4$ while the solution for the sample of FIG. 12b includes 0.2 g $KMnO_4$. A higher level of porosity was introduced in the sample produced with the higher concentration $KMnO_4$, and higher concentration of $KMnO_4$ resulted in some tapering of the pillars. Similar trends were found for samples of i-GaAs and n+ GaAs beyond 0.1 g $KMnO_4$. Under this regime, the maximum molar concentration of $KMnO_4$ before porosity occurs is approximate 9 μM ([HF]=0.55 M, [$KMnO_4$]=9 μM).

Figure 13:
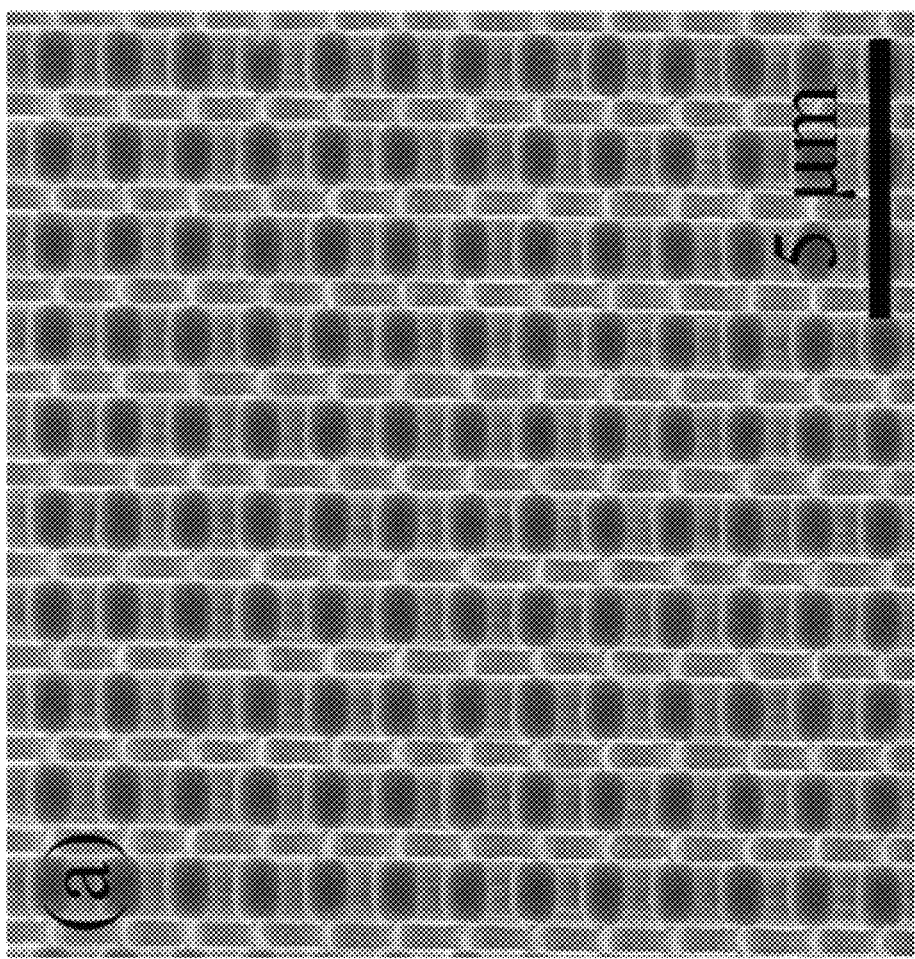
FIG. 13 is a SEM micrograph at a 45°-tilted view of p-type GaAs nanopillars. Pillars were formed in a solution of 20 mL HF, 10 mL DI, and 0.025 g of $KMnO_4$. Purely vertical sidewall profiles may be achieved under such conditions as a result of the minimization of lateral etching rates. Thus, the desired square profiles, dictated by the geometry of the gold mesh pattern, may be preserved.

FIG. 13 shows a 45°-tilted view of a p-type GaAs sample subjected to a MacEtch process at room temperature. Under optimized conditions, material dissociation can occur only along regions where a metal-semiconductor interface exists. The use of $KMnO_4$ as an oxidant can allow for hole-injection at the Au—GaAs interface such that HF may subsequently etch the oxidized material. Thus, during GaAs MacEtch, the gold layer sinks as material is removed from the substrate directly below, thereby allowing exposed GaAs to remain intact along regions where no gold coverage exists. MacEtch of GaAs has been observed at temperatures between 0° C. to 60° C., regardless of doping type. Vertical etch rates were observed to increase with temperature, as a result of enhanced hole-injection. Similarly, increasing oxidant molar concentrations results in a linear increase of vertical etch rate. However, variation in the dilution levels of the MacEtch solution has demonstrated a possible maximum vertical etch rate under a fixed 6.33 μM concentration of $KMnO_4$ and an HF:DI volumetric ratio of 2:1. Dilution beyond this ratio can reduce the effect of DI as a surfactant, thereby diminishing vertical etch rates. The vertical etch rates of SI- and n-type GaAs samples are comparable under all etching conditions tested. In contrast, p-type GaAs samples consistently etched at rate nearly twice as fast as SI- and n-type samples. This is attributed to the presence of excess holes in the p-type samples, reducing the barrier for oxidation. Based on the wide parameter space explored, MacEtch of GaAs of all doping types at room temperature can occur with the same solution. However, increasing oxidant concentrations beyond a certain level can result in the formation of porous GaAs surfaces, which may adversely influence device performance.

Samples of p-i-n GaAs were also tested. The p-i-n GaAs samples were produced by forming an intrinsic or non-doped GaAs (i-GaAs) layer on an n-type GaAs (n+ GaAs) substrate. A p-type GaAs (p-GaAs) layer was formed on the n+ GaAs substrate such that the i-GaAs layer was sandwiched between the n+ GaAs substrate and the p-GaAs layer. The i-GaAs layer was about 300 nm thick and the p-GaAs layer was doped with Zn and was about 300 nm thick. All of the p-i-n GaAs samples were produced using a gold pattern.

Figure 14:
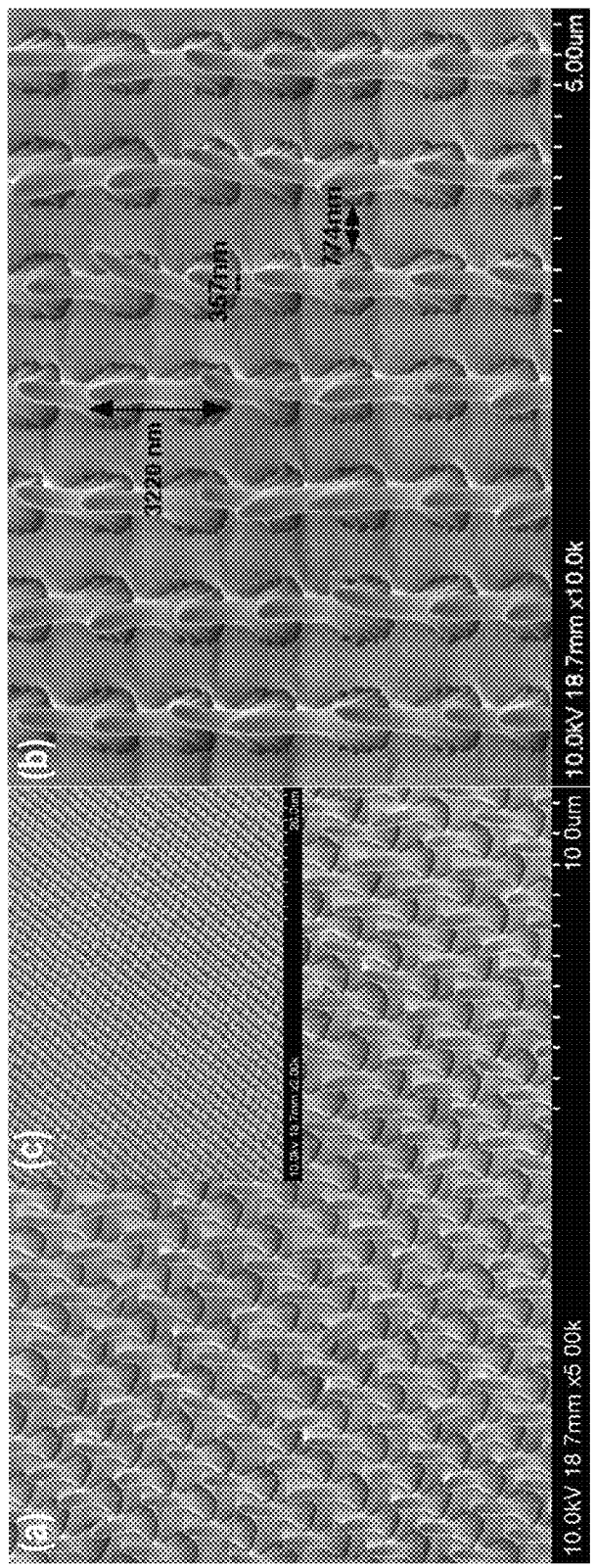
FIGS. 14a-14c are SEM micrographs of an etched p-i-n GaAs sample. MacEtch occurred at room temperature in a solution of 10 mL of HF, 20 mL of DI, and 0.1 g $KMnO_4$, for a period of 30 minutes. Under these conditions, the competition between h+ injection and material etching favors a high degree of oxidation, thereby allowing lateral etching to proceed in tandem with vertical etching. Thus, thinner nanopillars may be realized. MacEtched pillar dimensions are noted in FIG. 14b.

A first sample of p-i-n GaAs was etched in a solution of 10 mL HF, 20 mL DI, 0.1 g of $KMnO_4$ at room temperature for 30 minutes. FIGS. 14a-14c are SEM micrographs of the first p-i-n GaAs sample. Compared to the solution used for the sample of FIGS. 10a-10b, the competition between h+ injection and material etching favored higher degree of oxidation which caused a higher degree of lateral etching. As a result, the nanopillars are thinner.

Figure 15:
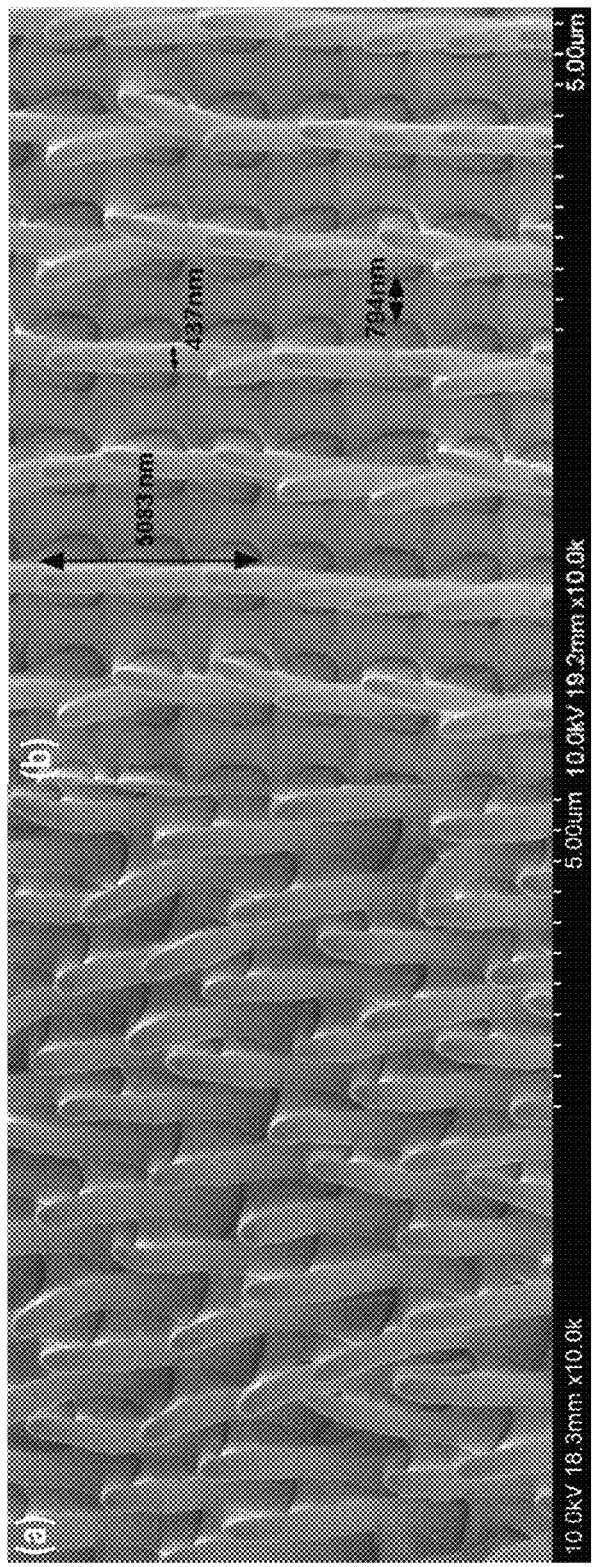
FIGS. 15a-15b are SEM micrographs of the p-i-n GaAs sample further etched for an additional 15 minutes period (total etch period of 45 minutes) under the same conditions as described in FIG. 14. Pillar heights are increased due to additional vertical etching as noted by the pillar dimensions specified in FIG. 15b. However, lateral etching is quenched at the nanopillar tips. This demonstrates that lateral etching may only occur within a finite distance from the Au/GaAs interface as a result of the finite diffusion lengths of holes injected at the metal/semiconductor interface.

The first sample of p-i-n GaAs was then etched in a solution that was the same for an additional 15 minutes. FIGS. 15a-15b are SEM micrographs of the further etched sample showing that the vertical etching proceeded at a constant rate leading to taller pillars. However, lateral etching was quenched at the tip of the pillars. Therefore, lateral etching only occurred within a finite distance from the gold layer.

Figure 16:
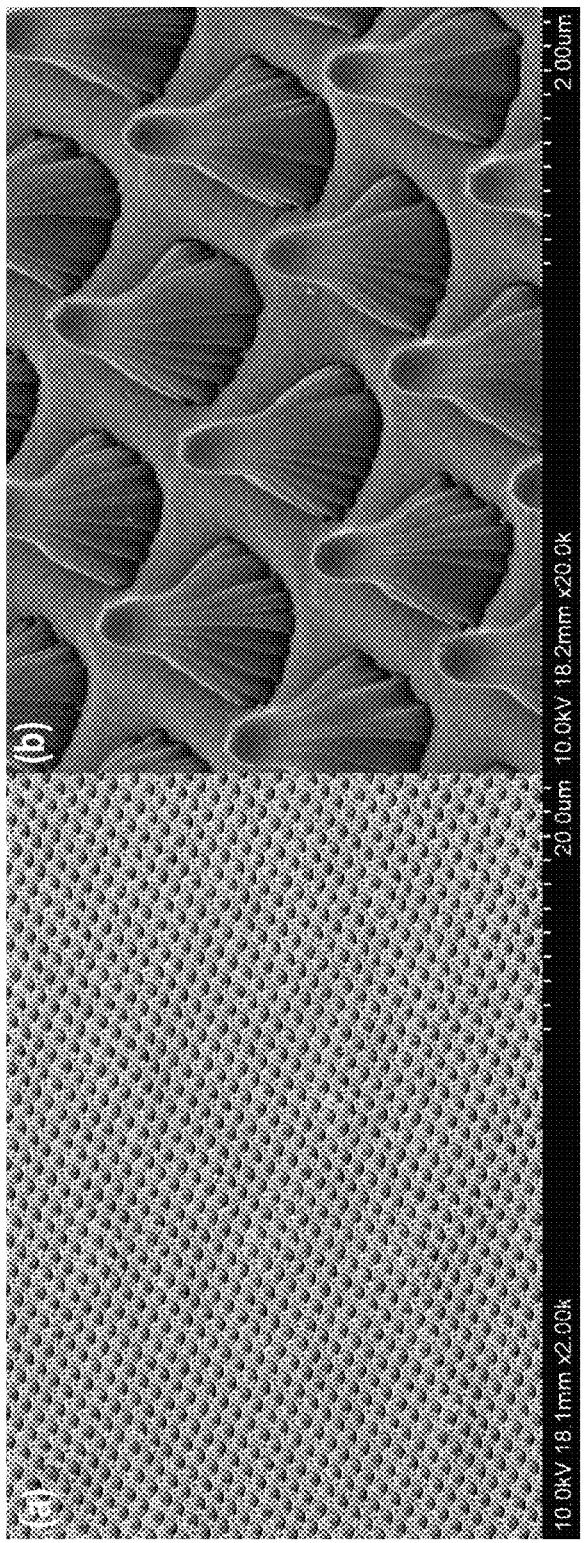
FIGS. 16a-16b are SEM micrographs of an etched p-i-n GaAs sample. MacEtched occurred in the an identical solution as described in the case of FIGS. 14 and 15; however the etch period was limited to only a 10 minute duration. Thus, the dissimilar rates of vertical and lateral etching may be exploited for the formation of pyramidal structures, as opposed to high aspect-ratio pillar structures.

A second sample of p-i-n GaAs was etched in a solution the same as the first sample for 10 minutes to see the early etch stages where lateral etching started. FIGS. 16a-16b are SEM micrographs of the second sample showing lateral etching. The difference in vertical and lateral etch rate can be taken advantage of to form pyramidal instead of pillar structures. The surface roughness is noted as being induced by irregular gold pattern edge profile that was transferred during sidewall etching.

Figure 17:
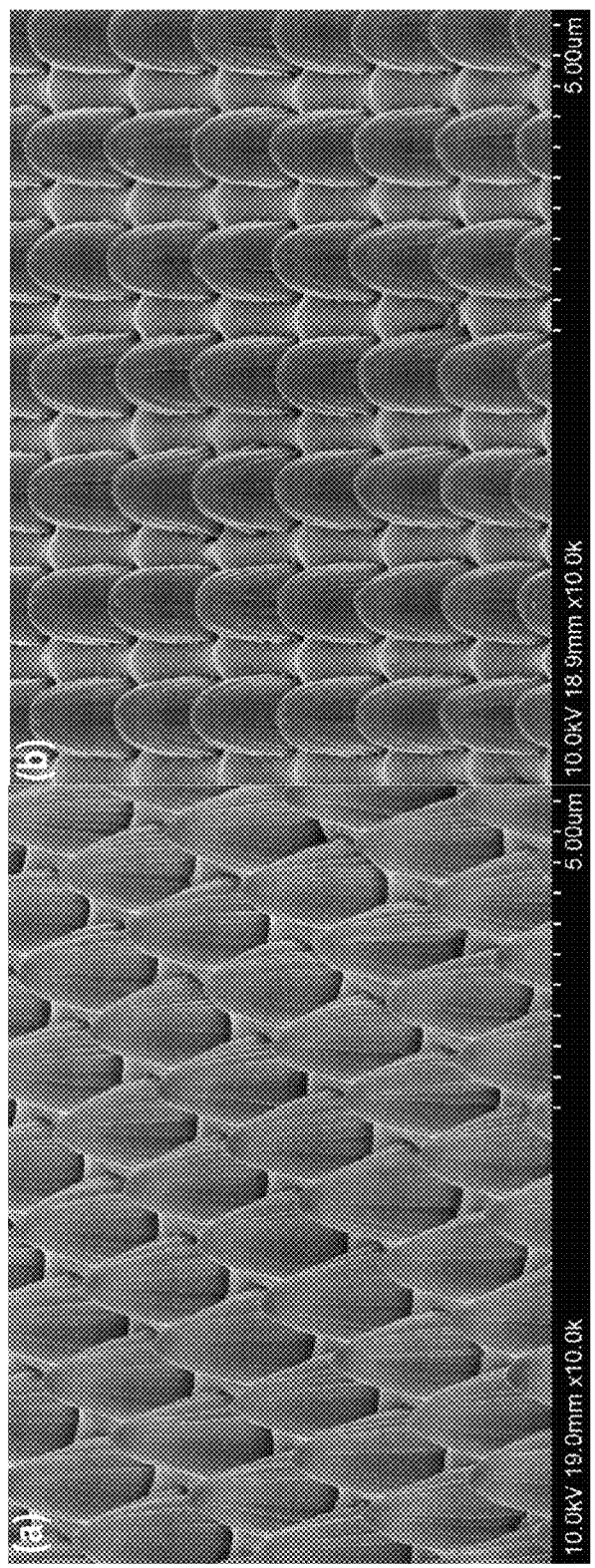
FIGS. 17a-17b are SEM micrographs of the same p-i-n GaAs sample as shown in FIG. 16 after an additional (second) MacEtch procedure. After the initial 10 minute etching period in the solution of 10 mL of HF, 20 mL of DI, and 0.1 g $KMnO_4$, a second etching process was carried out in a separate solution of 20 mL of HF, 10 mL of DI, and 0.1 g of $KMnO_4$ for a period of 3.5 minutes. Note that the second etch process is in a solution where lateral etch rates were quenched. Thus, the morphology of the MacEtched features can be tuned such that tapered, pyramidal tips and non-tapered, squared bases can be achieved. Squared bases and rounded tips can be clearly distinguished in FIG. 17b.

The second sample was then further etched in a solution of solution of 20 mL HF, 10 mL DI, 0.1 g of $KMnO_4$ at room temperature for 3.5 minutes. FIGS. 17a-17b are SEM micrographs of the further etched second sample. The solution that was used resulted in lower lateral etching compared to the solution used for the initial etching. The vertical etching dominated resulting in the base, square structure translating vertically. Thus, as show in FIGS. 17a-17b, pillars with a square base and a pyramidal tip can be formed. Therefore, the morphology of the etched structures can be controlled by varying the competition between vertical and lateral etching by tuning dilution of the solution.

Figure 18:
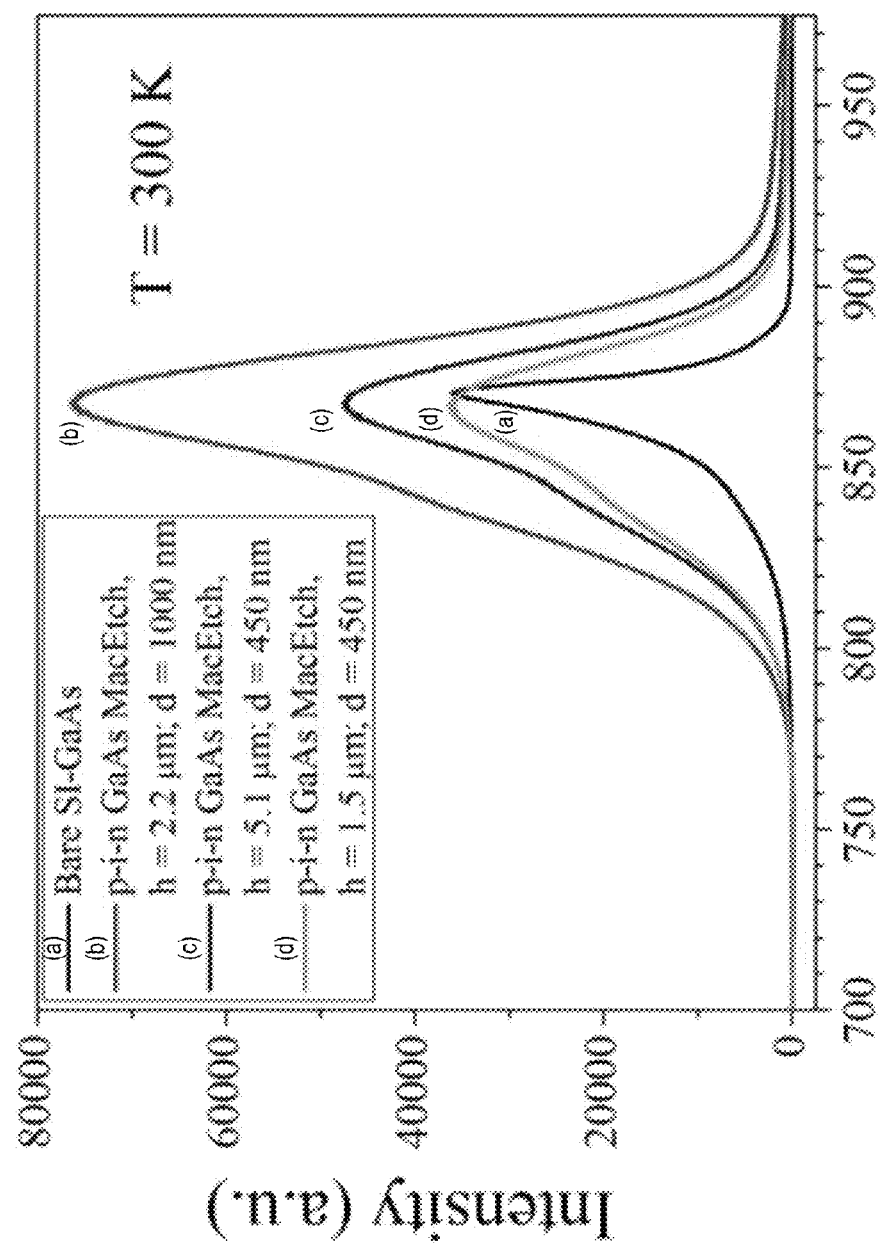
FIG. 18 is a PL spectra of periodic GaAs nanopillar arrays with various dimensions. Taller and thicker MacEtched pillars result in higher intensity PL emission. This is a direct result of the additional surface exposure after the MacEtch procedure. Nanopillar structures ((b), (c), and (d) curves) provide more surfaces from which photons may be emitted, in comparison with a bare non-MacEtched substrate ((a) curve), while reducing the opportunity for re-absorption within the bulk. The greater the volume of the exposed or MacEtched features, the greater the extraction efficiency of emitted photons can be. Thus, pillars that are taller and thicker (e.g., (b) curve from features with heights of 2.2 µm and diameters of 1000 nm) can result in higher intensity PL emission as compared to shorter and thinner pillars (e.g., (d) curve from features with heights of 1.5 µm and diameters of 450 nm)

The morphology of GaAs pillars may also be altered as a function of the MacEtch solution employed. While vertical etch rates are quenched under higher dilution levels, lateral etch rates may be enhanced. This allows for a variation of the nanostructure geometry. Shown in FIG. 18 are the room temperature PL spectra of periodic GaAs nanopillar arrays with various dimensions. The periodic pillar arrays show a clear increase of PL intensity as compared to the planar substrate, and the intensity increases with pillar height and width, indicating higher extraction efficiency. In addition to homogeneous GaAs pillars, InGaAs/GaAs superlattice and axial p-i-n junction GaAs pillar arrays have also been successfully created via MacEtch.

Figure 19:
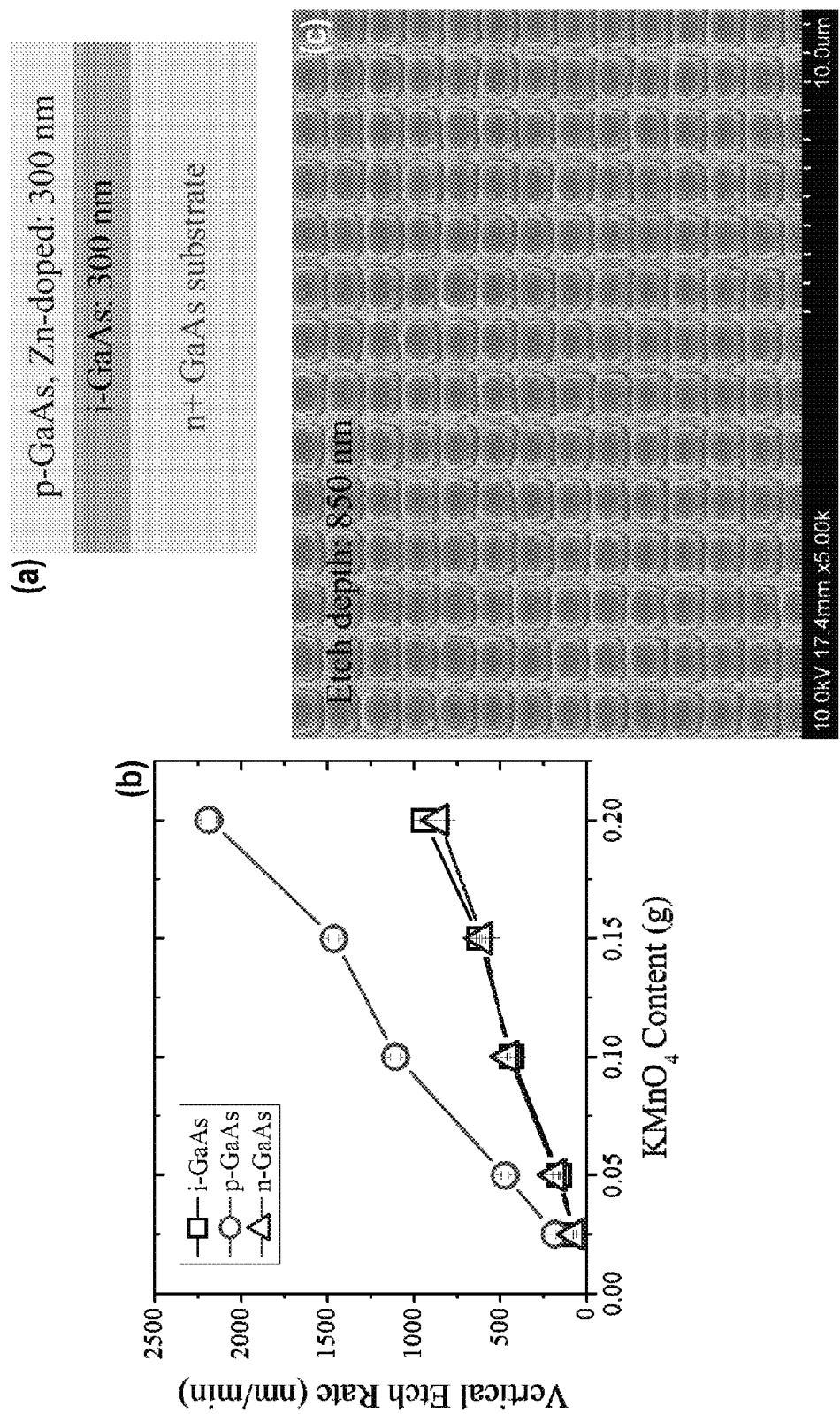
FIG. 19a-19c are (a) a schematic of a p-i-n GaAs structure consisting of an n+ GaAs (100) substrate, an intermediate intrinsic (undoped) GaAs segment with 300 nm thickness, and a top layer of GaAs with thickness of 300 nm, doped with Zn to a dopant concentration of $p=1\times10^{18}$ cm$^{-3}$, (b) a plot of amount of KMnO$_4$ in the etching solution as a function of vertical etch rate, and (c) a SEM micrograph of an etched p-i-n GaAs structure in a solution consisting of 15 mL of HF, 15 mL of DI, and 0.05 g of KMnO$_4$, etched for a period of 10 minutes at room temperature.

MacEtch can be used to form p-i-n GaAs or InGaAs/GaAs quantum well nanopillar arrays for use in LED and solar cell applications. FIG. 19a is a schematic of a p-i-n GaAs structure that was etched with an etchant solution including the following molar concentrations and ratios: [HF]=0.42 M, [$KMnO_4$]=9.50E-6 M, [HF]/[$KMnO_4$]=44234, and [$KMnO_4$]/[HF]=2.3E-5. FIG. 19b is a plot of amount of $KMnO_4$ in the etching solution as a function of vertical etch rate. FIG. 19c is a SEM micrograph of the p-i-n GaAs structure patterned with gold and etched with a single solution to form pillars including the p-i-n GaAs structure. The etch depth was about 850 nm.

Figure 20:
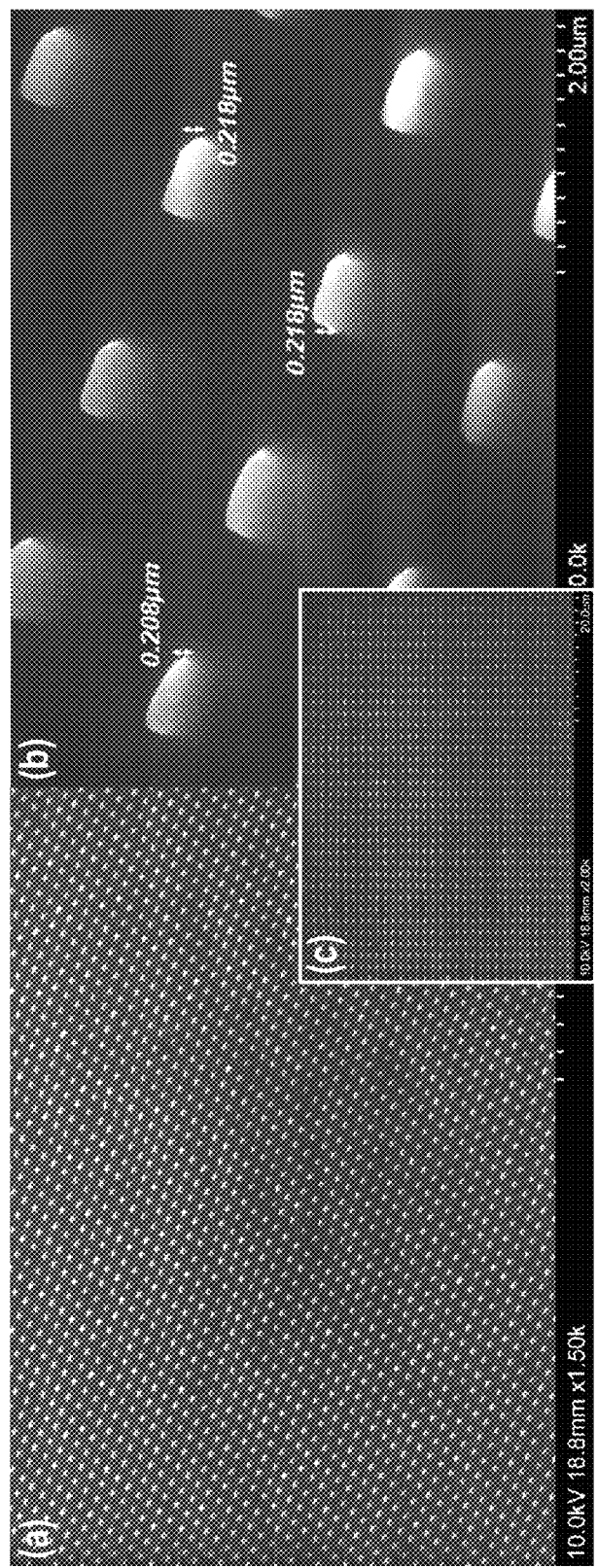
FIGS. 20a-20c are SEM micrographs of a structure similar to that of FIG. 19c with trenches filled with a photopolymer SU-8-2 with about 200 nm of the pillar tips exposed. SU-8-2 polymer was first deposited by spin coating at a frequency of 4500 RPM for a period of 60 seconds following an initial settling period of 3 minutes. After spin coating, the polymer layer was soft baked at 65° C. for 2 minutes, followed a second soft bake step at 95° C. for 2 minutes. Subsequently, oxygen plasma reactive ion etching (RIE) for a period of 10 minutes allowed for planarization of the SU-8-2 layer and exposure of the nanopillar tips.

In order to produce an LED, a sample similar to that of the p-i-n GaAs of FIG. 19c was encapsulated with a photopolymer SU-8-2. The sample was planarized and about 200 nm of the pillar tips exposed. FIGS. 20a-20c are SEM micrographs of the samples showing about 200 nm of the pillar tips exposed. ITO was sputtered onto pillar tips. Since only about 200 nm of the pillar tips were exposed, only the p-GaAs layer was exposed. Thus, the ITO contacted the p-GaAs and did not contact the i-GaAs and the n+ GaAs. The resulting structure can be used in an LED.

Figure 21:
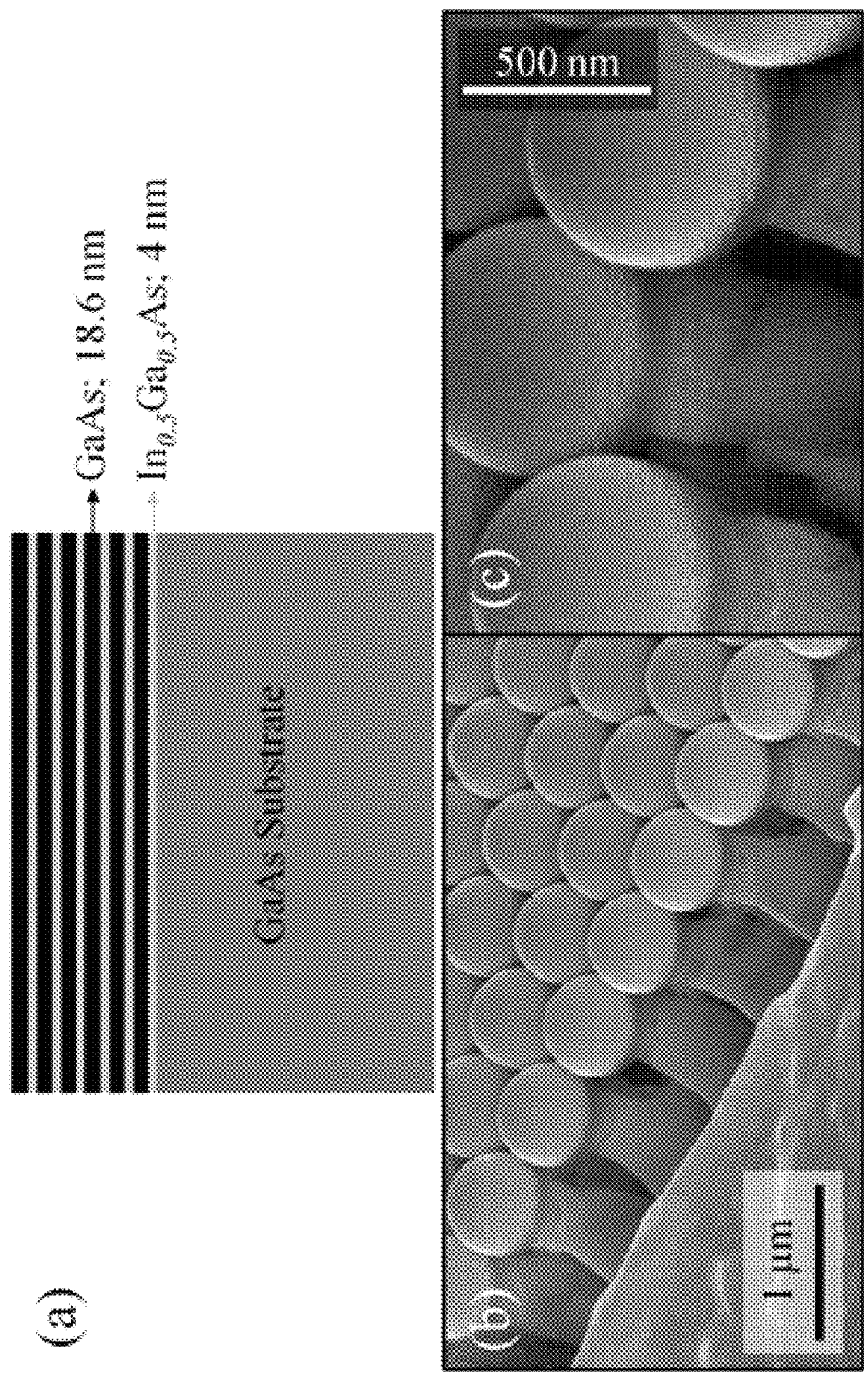

Superlattice heterostructured samples including six periods of alternating layers of GaAs and $In_xGa_{1-x}As$ (x=0.5) were grown via metalorganic chemical vapor depositions (MOCVD). FIG. 21a is a schematic of the GaAs and InGaAs structure. The thickness of the GaAs and InGaAs layers were 18.6 nm and 4 nm, respectively. Nanosphere lithography patterning was carried out by spin-coating polystyrene spheres of 750 nm diameter on the as-grown superlattice samples. After spin-coating, the diameter reduction of the polystyrene spheres was achieved through an oxygen plasma reactive ion etching (RIE) process for 90 seconds, allowing for the closely packed spheres to be separated by a spacing of approximately 100 nm. A gold layer with a thickness of 30 nm was next deposited on the samples by electron-beam evaporation. Subsequently, MacEtch was carried out in a solution composed of 15 mL of HF, 15 mL of deionized water (DI), and 0.1 g KMnO4, at room temperature for a period of 5 minutes. FIGS. 21b and 21c are SEM micrographs of the etched sample.

The etching methods described herein offer the potential to create high quality III-V photonic devices quickly and efficiently. For example, the realization of high aspect ratio III-V nanostructure arrays by wet etching can potentially transform the fabrication of a variety of optoelectronic device structures including distributed Bragg reflector (DBR) and distributed feedback (DFB) semiconductor lasers, where the surface grating is currently fabricated by dry etching. Because it can occur at room temperature, MacEtch is not likely to introduce metal contamination, in contrast to bottom-up high-temperature metal-catalyzed nanowire growth techniques, and since MacEtch is a wet etch process, MacEtch avoids ion-induced surface damage typically seen in dry etch processes. This can be crucial to III-V nanostructures for optoelectronic applications. For silicon, such surface damage can be repaired by thermal annealing. However, for compound semiconductors, such as GaAs, thermal repair is not completely effective mainly because of the difficulty of maintaining stoichiometry.

Such III-V nanostructures can be also used in other devices such as distributed feedback (DFB) and distributed Bragg reflector (DBR) lasers, photonic crystals, solar cells and light emitting diodes (LEDs) that involve surface relief structures for light trapping, and simply creating micron and nanometer scale mesa structures that is currently done by dry etching. Since MacEtch is a wet etch, the container holding the solution can be sized to fit essentially any desired device.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method of metal assisted chemical etching, the method comprising:
   providing an electrically conductive film pattern disposed on a semiconductor substrate, the semiconductor substrate comprising a III-V semiconductor; and
   selectively removing at least a portion of the III-V semiconductor immediately below the conductive film pattern by immersing the electrically conductive film pattern and the semiconductor substrate into an etchant solution comprising an acid and an oxidizing agent having an oxidation potential less than an oxidation potential of hydrogen peroxide.

2. The method of claim 1, wherein the etchant solution does not remove substantial portions of the III-V semiconductor which do not have the conductive film pattern disposed thereon.

3. The method of claim 1, wherein the III-V semiconductor comprises GaAs.

4. The method of claim 1, wherein the III-V semiconductor is doped.

5. The method of claim 1, wherein the conductive film comprises gold.

6. The method of claim 1, wherein the oxidizing agent comprises potassium permanganate ($KMnO_4$).

7. The method of claim 1, wherein the acid is selected from the group consisting of sulfuric acid ($H_2SO_4$) and hydrofluoric acid (H F).

8. The method of claim 1, further comprising varying a concentration of the oxidizing agent in the etchant solution.

9. The method of claim 1, wherein the selectively removing the portion of the III-V semiconductor takes place at a temperature of from about 40° C. to about 45° C.

10. The method of claim 1, wherein the conductive film pattern and the semiconductor substrate are immersed in the etchant solution for about 3 to about 5 minutes.

11. The method of claim 1, further comprising:
    generating holes ($h^+$) from the oxidizing agent on the conductive film pattern;
    diffusing the holes ($h^+$) to a boundary of the conductive film pattern, III-V semiconductor, and etchant solution; and
    removing the holes ($h^+$) from semiconductor substrate substantially immediately upon the holes ($h^+$) reaching the boundary.

12. The method of claim 1, further comprising forming features in the semiconductor substrate having a length-to-width aspect ratio of at least about 5:1, thereby forming an array of high aspect ratio semiconductor nanostructures.

13. The method of claim 12, wherein the array of high aspect ratio semiconductor nanostructures is an ordered array of nanowires.

14. The method of claim 1, wherein a concentration of the oxidizing agent in the etchant solution is in a range of from about 20 mM to about 150 mM.

15. A method of metal assisted chemical etching,
    the method comprising:
    providing a conductive film pattern disposed on a semiconductor substrate, the semiconductor substrate comprising a III-V semiconductor; and
    selectively removing at least a portion of the III-V semiconductor immediately below the conductive film pattern by immersing the conductive film pattern and the semiconductor substrate into an etchant solution comprising an acid and an oxidizing agent selected from the group consisting of potassium permanganate ($KMnO_4$) and potassium persulfate ($K_2S_2O_8$).

16. The method of claim 15, wherein the III-V semiconductor comprises gallum arsenide.

17. The method of claim 15, wherein a concentration of the oxidizing agent in the etchant solution is in a range of from about 20 mM to about 150 mM.

18. The method of claim 15, wherein the selectively removing the portion of the III-V semiconductor takes place at a temperature of from about 40° C. to about 45° C.

* * * * *